(12) United States Patent
Chen

(10) Patent No.: US 8,975,679 B1
(45) Date of Patent: Mar. 10, 2015

(54) SINGLE-POLY NON-VOLATILE MEMORY CELL

(71) Applicant: Gembedded Tech Ltd., Tortola (VG)

(72) Inventor: Chi-Tsai Chen, Taichung (TW)

(73) Assignee: Gembedded Tech Ltd., Road Town, Tortola (VG)

( * ) Notice: Subject to any disclaimer, the term of this patent is extended or adjusted under 35 U.S.C. 154(b) by 0 days.

(21) Appl. No.: 14/481,905

(22) Filed: Sep. 9, 2014

Related U.S. Application Data

(60) Provisional application No. 61/875,700, filed on Sep. 10, 2013, provisional application No. 61/876,775, filed on Sep. 12, 2013, provisional application No. 61/882,024, filed on Sep. 25, 2013, provisional application No. 61/887,470, filed on Oct. 7, 2013, provisional application No. 61/892,425, filed on Oct. 17, 2013.

(51) Int. Cl.
*H01L 27/108* (2006.01)
*H01L 27/115* (2006.01)
*H01L 29/94* (2006.01)

(52) U.S. Cl.
CPC .......... *H01L 27/11558* (2013.01); *H01L 29/94* (2013.01)
USPC ........................................................ 257/298

(58) Field of Classification Search
CPC ... H01L 27/222; H01L 27/24; H01L 27/2436; H01L 45/04; H01L 2924/1443
See application file for complete search history.

(56) References Cited

U.S. PATENT DOCUMENTS

| | | |
|---|---|---|
| 5,301,150 A | 4/1994 | Sullivan et al. |
| 5,457,652 A * | 10/1995 | Brahmbhatt ............. 365/185.27 |
| 5,504,706 A | 4/1996 | D'Arrigo et al. |
| 5,736,764 A | 4/1998 | Chang |
| 5,761,121 A | 6/1998 | Chang |
| 5,761,126 A | 6/1998 | Chi et al. |
| 5,841,165 A | 11/1998 | Chang et al. |
| 5,844,271 A | 12/1998 | Sethi et al. |
| 6,044,018 A | 3/2000 | Sung et al. |
| 6,100,560 A | 8/2000 | Lovett |
| 6,172,392 B1 | 1/2001 | Schmidt et al. |
| 6,215,700 B1 | 4/2001 | Fong et al. |
| 6,324,097 B1 | 11/2001 | Chen et al. |
| 6,512,700 B1 | 1/2003 | McPartland et al. |
| 6,631,087 B2 | 10/2003 | Di Pede et al. |
| 7,078,761 B2 | 7/2006 | Wang et al. |
| 7,099,192 B2 | 8/2006 | Wang et al. |
| 7,177,182 B2 | 2/2007 | Diorio et al. |
| 7,348,621 B2 | 3/2008 | Moore |

(Continued)

*Primary Examiner* — Bilkis Jahan
(74) *Attorney, Agent, or Firm* — Winston Hsu; Scott Margo

(57) ABSTRACT

A single-poly NVM cell includes a substrate having an isolation region separating a first OD region from a second OD region, a read transistor within the first OD region, and a coupling capacitor within the second OD region. A first ion well completely overlaps with the first oxide define region. The read transistor includes a drain region, a source region, a channel region, a single-poly floating gate overlying the channel region, and a gate dielectric layer between the floating gate and the channel region. The coupling capacitor includes a shallow ion well, a heavily-doped, ultra-shallow dopant region in the shallow ion well, a single-poly charge-storage floating gate overlying the heavily-doped, ultra-shallow dopant region, and a gate dielectric layer under the charge storage floating gate. The shallow ion well has a junction depth that is substantially equal to or shallower than a trench depth of the isolation region.

20 Claims, 14 Drawing Sheets

(56) References Cited

U.S. PATENT DOCUMENTS

| | | |
|---|---|---|
| 7,423,903 B2 | 9/2008 | Lin et al. |
| 7,671,396 B2 | 3/2010 | Fenigstein et al. |
| 7,671,401 B2 | 3/2010 | Fang et al. |
| 8,273,617 B2 | 9/2012 | Thompson et al. |
| 8,320,180 B2 | 11/2012 | Kalnitsky et al. |
| 8,472,251 B2 * | 6/2013 | Lee et al. ............ 365/185.1 |
| 8,592,886 B2 | 11/2013 | Hsu et al. |
| 2007/0121381 A1 * | 5/2007 | Kalnitsky et al. ........ 365/185.18 |
| 2008/0266958 A1 * | 10/2008 | Haggag et al. .......... 365/185.11 |
| 2009/0201742 A1 * | 8/2009 | Lee et al. ............ 365/185.24 |
| 2009/0244971 A1 * | 10/2009 | Lee et al. ............ 365/185.08 |
| 2011/0169064 A1 * | 7/2011 | Chou et al. ............ 257/298 |
| 2013/0234227 A1 | 9/2013 | Chen et al. |

\* cited by examiner

SINGLE-POLY NON-VOLATILE MEMORY CELL

CROSS REFERENCE TO RELATED APPLICATIONS

This application claims priority from U.S. provisional application Ser. No. 61/875,700 filed Sep. 10, 2013, U.S. provisional application Ser. No. 61/876,775 filed Sep. 12, 2013, U.S. provisional application Ser. No. 61/882,024 filed Sep. 25, 2013, U.S. provisional application Ser. No. 61/887,470 filed Oct. 7, 2013, and U.S. provisional application Ser. No. 61/892,425 filed Oct. 17, 2013, which are incorporated herein by reference in their entirety.

BACKGROUND OF THE INVENTION

1. Field of the Invention

The present invention relates generally to non-volatile memory (NVM) devices. More particularly, the present invention relates to a single polycrystalline silicon (single-poly) NVM cell.

2. Description of the Prior Art

Nonvolatile memory (NVM) devices are well known in the art. A NVM device does not lose its data when the system or device is turned off. As the demand for small size portable electrical devices such as cellular phones increases, there is a great need of the embedded memory for logic circuits and system on a chip. High-performance embedded memory is a key component in VLSI or ULSI because of its high-speed and wide bus-width capability, which eliminates inter-chip communication. A NVM device, which is fully compatible with CMOS logic processes and has low power consumption, improved writing efficiency, low cost and high packing density is highly desirable.

A NVM device typically comprises a MOS transistor having a source, a drain, a floating gate, and a control gate. Electrons may be transferred from the floating gate to the substrate by tunneling through a thin silicon dioxide layer. Tunneling is the process by which an NVM can be either erased or programmed. Storage of the charge on the floating gate allows the threshold voltage to be electrically altered between a low and a high value to represent logic 0 and 1, respectively. In floating gate memory devices, charge or data is stored in the floating gate and is retained when the power is removed.

To embed memory cells into a standard logic process without changing the single-poly process typically used in the fabrication of the logic circuitry, the single-poly memory scheme has been developed. The prior art single-poly memory cell typically includes $N^+$ source and $N^+$ drain regions formed in a P-type substrate and a polycrystalline silicon gate overlying a channel region extending between the source and drain regions. An N-type diffusion region formed in the P-type substrate serves as the control gate and is capacitively coupled to a floating gate via a thin gate oxide layer. The single-poly memory cell may be programmed by electron-tunneling from the floating gate to the substrate.

Although compatible with standard CMOS fabrication, conventional single-poly NVM suffers from high-voltage operation, slow programming, and incapability of electrical erase.

U.S. Patent Pub. No. 2009/0201742 A1 discloses a single-poly NVM cell that can be programmed and erased with low operation voltages. The single-poly NVM cell includes a programming charge coupling MOS capacitor formed in a first P well and a storage MOS transistor formed in a second P well. The first and second P wells are formed in a deep N well in a P-type substrate. The programming charge coupling MOS capacitor comprises $N^+$ source and $N^+$ drain regions, and a program-coupling floating gate that is electrically connected to a charge-storage floating gate of the storage MOS transistor to form a floating gate node. The $N^+$ source and $N^+$ drain regions and the first P well of the programming charge coupling MOS capacitor are commonly connected to a well biasing voltage. However, to establish a large coupling ratio, the physical size of the MOS capacitor is approximately 10 times greater than that of the storage MOS transistor.

As the size of memory cells shrinks, the capacitance area between the floating gate and the control gate shrinks as well. As a result, the drive current and/or coupling ratio are usually insufficient to effectively perform operations such as programming, erasing and reading. Therefore, there is a need in this industry to provide a single-poly NVM cell with high coupling ratio suited for deep sub-micron dimensions, preferably 65 nm technology nodes and beyond, which does not exhibit the above-mentioned problems.

SUMMARY OF THE INVENTION

It is one object of this invention to provide a single-poly, one-transistor one-capacitor (1T1C) NVM cell with high coupling ratio, which is compatible with current CMOS logic processes with minor change by adding one process layer, and which has a shrinkable and scalable structure for deep sub-micron dimensions, preferably 65 nm technology nodes and beyond.

It is another object of this invention to provide a single-poly NVM cell with improved coupling ratio when compared to the NVM cells of the prior art, which is suited for applications including but not limited to one-time programmable (OTP) memory, multi-time programmable (MTP), electrically erasable programmable read only memory (EEPROM), or flash memory.

According to one embodiment of the invention, a single-poly non-volatile memory (NVM) cell includes a semiconductor substrate of a first conductivity type, having thereon an isolation region separating a first oxide define region from a second oxide define region, a first ion well in the semiconductor substrate, a read transistor within the first OD region, and a coupling capacitor within the second OD region. The first ion well completely overlaps with the first oxide define region and does not overlap with the second oxide define region. The read transistor includes a drain region, a source region, a channel region between the drain region and the source region, a floating gate formed of a single polycrystalline silicon layer overlying the channel region, and a gate dielectric layer between the floating gate and the channel region.

The coupling capacitor includes a shallow ion well of a second conductivity type opposite to the first conductivity type, a heavily-doped, ultra-shallow dopant region in the shallow ion well, a contact region in the heavily-doped, ultra-shallow dopant region, a charge storage floating gate formed of a single polycrystalline silicon layer overlying the heavily-doped, ultra-shallow dopant region, and a gate dielectric layer between the charge storage floating gate and heavily-doped, ultra-shallow dopant region.

The charge storage floating gate of the coupling capacitor is electrically coupled to the floating gate of the read transistor. The heavily-doped, ultra-shallow dopant region and the shallow ion well serve as a charge pumping element.

According to one embodiment of the invention, the first ion well has the second conductivity type.

According to another embodiment of the invention, the first ion well has the first conductivity type.

According to another embodiment of the invention, the shallow ion well has the second conductivity type, the heavily-doped, ultra-shallow dopant region has the first conductivity type, and the contact region has the first conductivity type.

According to another embodiment of the invention, the shallow ion well, the heavily-doped, ultra-shallow dopant region, and the contact region all have the second conductivity type.

According to another embodiment of the invention, the shallow ion well has a junction depth that is substantially equal to or shallower than a trench depth of the isolation region.

According to another embodiment of the invention, a junction between the shallow ion well and the heavily-doped, ultra-shallow dopant region has a junction depth that is substantially equal to or shallower than the trench depth of the isolation region.

According to another embodiment of the invention, the trench depth ranges between 0.1 micrometers and 1.0 micrometers.

According to another embodiment of the invention, the shallow ion well is formed directly within the semiconductor substrate, and is not formed within an ion well.

According to another embodiment of the invention, the single-poly NVM cell further comprises an extra dopant region encompassing the contact region. The extra dopant region partially overlaps with the shallow ion well and the heavily-doped, ultra-shallow dopant region.

According to another embodiment of the invention, the single-poly NVM cell further comprises a lightly-doped dopant region of the first conductivity type, wherein the heavily-doped, ultra-shallow dopant region is formed within the lightly-doped dopant region of the first conductivity type.

According to another embodiment of the invention, a junction between the shallow ion well of the second conductivity type and the lightly-doped dopant region of the first conductivity type has a junction depth that is shallower than a trench depth of the isolation region.

According to another embodiment of the invention, the single-poly NVM cell further comprises a second ion well of the second conductivity type within the second OD region. The second ion well of the second conductivity type is spaced apart from the first ion well and partially overlaps with the second OD region.

According to another embodiment of the invention, the single-poly NVM cell further comprises a third ion well of the first conductivity type within the second OD region between the first ion well and the second ion well. The second ion well of the second conductivity type partially overlaps with the second OD region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1A:
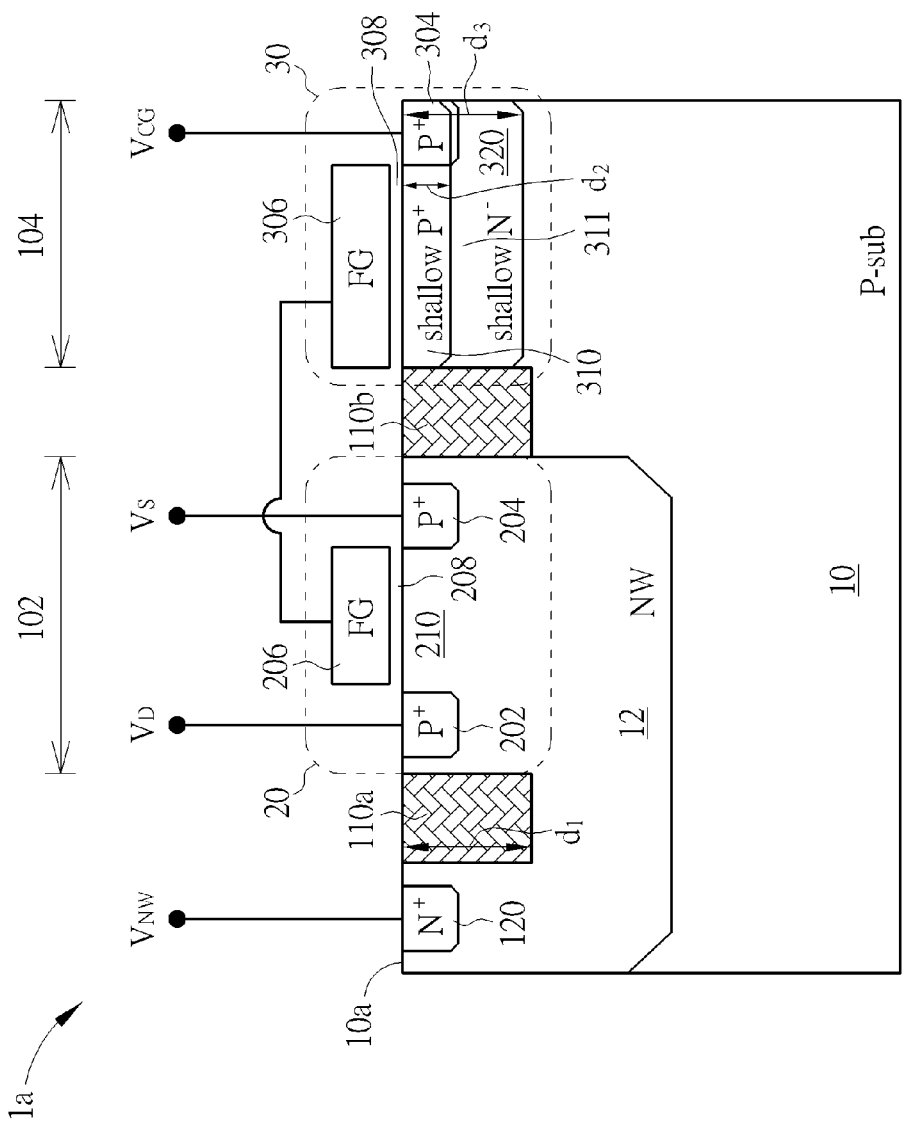
FIG. 1A is a schematic, cross-sectional view of a single-poly NVM cell in accordance with one embodiment of the invention, wherein the read transistor is PMOS.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms "wafer" and "substrate" used herein include any structure having an exposed surface onto which at least a layer is deposited according to the present invention, for example, to form the integrated circuit (IC) structure. The term "substrate" is understood to include semiconductor wafers. The term "substrate" is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art.

The term "horizontal" as used herein is defined as a plane parallel to the conventional major plane or surface of the semiconductor substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

The following detailed description is, therefore, not to be taken in a limiting sense, and the scope of the present invention is defined only by the appended claims, along with the full scope of equivalents to which such claims are entitled.

FIG. 1A is a schematic, cross-sectional view of a single-poly NVM cell in accordance with one embodiment of the invention. The single-poly NVM cell is suited for the applications including but not limited to one-time programmable (OTP) memory, multi-time programmable (MTP), electrically erasable programmable read only memory (EEPROM), or flash memory, and may be embedded in a system-on chip (SoC) for example. Further, the proposed single-poly NVM may be an integrated on-chip memory that supports the logic core to accomplish intended functions.

As shown in FIG. 1A, the single-poly NVM cell 1a comprises a semiconductor substrate 10 having a first conductivity type. For example, the semiconductor substrate 10 may be a P-type silicon substrate (P-Sub) according to the embodiment. An ion well 12 of a second conductivity type is formed in a major surface 10a of the semiconductor substrate 10. For example, the ion well 12 of the second conductivity type may be an N well (NW) according to the embodiment. The ion well 12 of the second conductivity type may be electrically coupled to $V_{NW}$ through an N$^+$ contact region 120 formed within the ion well 12 of the second conductivity type.

Shallow trench isolation (STI) regions 110a and 110b are formed in the major surface 10a of the semiconductor substrate 10. The STI region 110b separates two oxide-define (OD) regions or active areas: the first OD region 102 and the second OD region 104. The STI regions 110a and 110b extend into the semiconductor substrate 10 to a trench depth $d_1$ that is shallower than the junction depth of the ion well 12. For example, the trench depth d1 may range between 0.1 micrometers and 1.0 micrometers.

A read transistor 20, as indicated by the dashed circle on the left-hand side, is formed within the first OD region 102. According to the embodiment, the read transistor 20 is a PMOS transistor and may comprise a P$^+$ drain region 202, a P$^+$ source region 204, a channel region 210 between the P$^+$ drain region 202 and the P$^+$ source region 204, a floating gate 206 formed of a single polycrystalline silicon layer overlying the channel region 210, and a gate dielectric layer 208 between the floating gate 206 and the channel region 210. The P$^+$ drain region 202 is separated from the N$^+$ contact region 120 by the STI region 110a. According to the embodiment, the gate dielectric layer 208 is made of the same material and has the same thickness as that used in the logic circuitry on the same integrated circuit chip. The P$^+$ drain region 202 may be electrically coupled to a drain voltage ($V_D$) and the P$^+$ source region 204 may be electrically coupled to a source voltage ($V_S$).

A coupling capacitor 30, as indicated by the dashed circle on the right-hand side, is formed within the second OD region 104. According to the embodiment, the coupling capacitor 30 may comprise a shallow ion well 320 of the second conductivity type, a heavily-doped, ultra-shallow dopant region 310 of the first conductivity type in the shallow ion well 320 of the second conductivity type, a contact region 304 of the first conductivity type in the heavily-doped, ultra-shallow dopant region 310, a charge storage floating gate 306 formed of a single polycrystalline silicon layer overlying the heavily-doped, ultra-shallow dopant region 310 of the first conductivity type, and a gate dielectric layer 308 between the charge storage floating gate 306 and heavily-doped, ultra-shallow dopant region 310.

According to the embodiment, the shallow ion well 320 of the second conductivity type may be a shallow N well, the heavily-doped, ultra-shallow dopant region 310 of the first conductivity type may be a P$^+$ ultra-shallow dopant region, and the contact region 304 of the first conductivity type may be a P$^+$ contact region. It is noteworthy that the shallow ion well 320 of the second conductivity type is formed directly within the semiconductor substrate 10, and is not formed within an ion well of the second conductivity type such as an N well. A PN junction 311 between the shallow ion well 320 of the second conductivity type and the heavily-doped, ultra-shallow dopant region 310 of the first conductivity type has a junction depth $d_2$ that is shallower than the trench depth $d_1$ of the STI regions 110a and 110b.

It is to be understood that according to another embodiment, the heavily-doped, ultra-shallow dopant region 310 and the contact region 304 may both have the second conductivity type as that of the shallow ion well 320. For example, the shallow ion well 320 may be a shallow N well, the heavily-doped, ultra-shallow dopant region 310 may be an N$^+$ ultra-shallow dopant region, and the contact region 304 may be an N$^+$ contact region.

According to the embodiment, the charge storage floating gate 306 of the coupling capacitor 30 is electrically coupled to the floating gate 206 of the read transistor 20. The P$^+$ contact region 304, the heavily-doped, ultra-shallow dopant region 310 of the first conductivity type (shallow P$^+$), and the shallow ion well 320 of the second conductivity type (shallow N well or shallow N$^-$) may be commonly connected to a control gate voltage ($V_{CG}$). The shallow ion well 320 of the second conductivity type and the heavily-doped, ultra-shallow dopant region 310 of the first conductivity type (shallow P$^+$) may be electrically coupled to $V_{CG}$ through the P$^+$ contact region 304 formed within the ultra-shallow dopant region 310 of the first conductivity type (shallow P$^+$). The gate dielectric layers 208 and 308 are made of the same material and have the same thickness as that used in the logic circuitry on the same integrated circuit chip. An additional layer or photomask may be added to the current single-poly logic process in order to form the shallow ion well 320 of the second conductivity type and the heavily-doped, ultra-shallow dopant region 310 of the first conductivity type (shallow P$^+$).

It is to be understood that although not shown in the figures, a pair of sidewall spacers may be formed on the opposite sidewalls of each of the floating gates 206 and 306, and a lightly doped drain (LDD) regions may be formed under the sidewall spacers.

The P+ drain region 202, the P+ source region 204, the P+ contact region 304 have substantially the same NP junction depth. The shallow ion well 320 has a junction depth $d_3$. According to the embodiment, the junction depth $d_3$ is deeper than the junction depth $d_2$ and is substantially equal to or shallower than the trench depth $d_1$ of the STI regions 110a and 110b. According to the embodiment, the multi-well scheme (shallow P+ 310/shallow N− 320/P-Sub 10) directly under the charge storage floating gate 306 may serve as a charge pumping element. The heavily-doped, ultra-shallow dopant region 310 of the first conductivity type (shallow P+) enhances the coupling ratio of the single-poly NVM cell 1a.

To form such multi-well scheme (shallow P+ 310/shallow N− 320/P-Sub 10), a patterned implant mask layer (not shown) may be formed on the semiconductor substrate 10 to reveal the second OD region 104. A first ion implantation process may be carried out to implant N type dopants into the second OD region 104 to form the shallow N− 320. A second ion implantation process is then carried out to implant P type dopants into the second OD region 104 to form the shallow P+ 310. Thereafter, a thermal oxidation process is performed to form the gate dielectric layer 308. An etch-back process may be performed to remove an upper portion of the gate dielectric layer 308. By thinning down the thickness of the gate dielectric layer 308, the coupling ratio of the memory cell is increased.

According to another embodiment, to form such multi-well scheme (shallow P+ 310/shallow N− 320/P-Sub 10), a patterned implant mask layer (not shown) may be formed on the semiconductor substrate 10 to reveal the second OD region 104. A first ion implantation process may be carried out to implant N type dopants into the second OD region 104 to form the shallow N− 320. A second ion implantation process is then carried out to implant P type dopants into the second OD region 104 to form a shallow P− (not shown). Thereafter, a thermal oxidation process is performed to form the gate dielectric layer 308. After the formation of the gate dielectric layer 308, a third ion implantation process is carried out to implant P type dopants into the second OD region 104 to form a shallow P+ 310. The heavily doped shallow P+ 310 helps increase the coupling ratio.

According to still another embodiment, the shallow P+ 310 and shallow N− 320 may be formed after the formation of the gate dielectric layer 308. For example, a thermal oxidation process is first performed to form the gate dielectric layer 308. A first ion implantation process may be carried out to implant N type dopants into the second OD region 104 to form the shallow N− 320. A second ion implantation process is then carried out to implant P type dopants into the second OD region 104 to form the shallow P+ 310. It is to be understood that in some cases, the shallow P+ 310 may be formed before the shallow N− 320.

It should be recognized that although the present invention has been illustrated schematically with the use of certain conductivity types, the opposite conductive types can also be implemented.

Figure 1B:
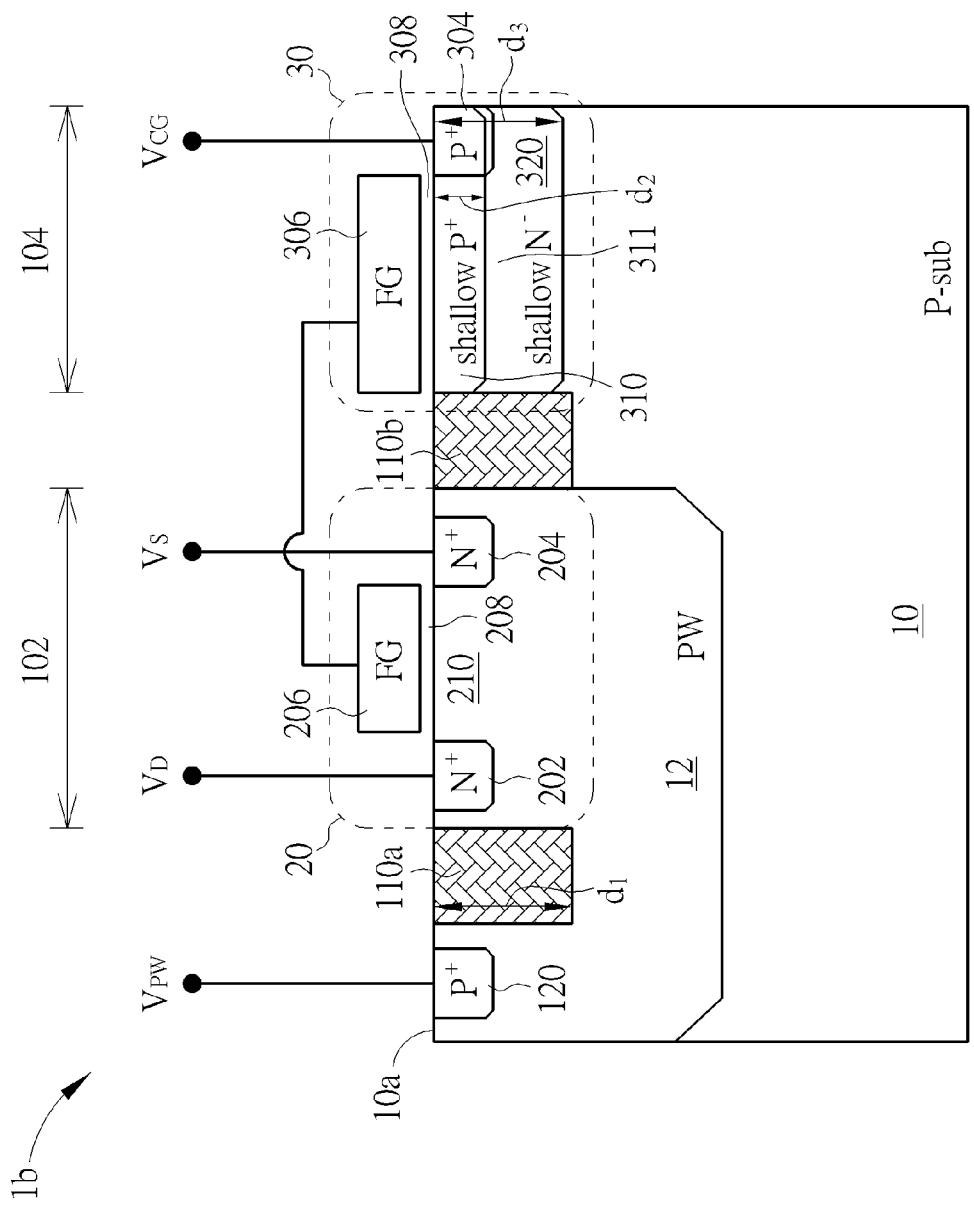
FIG. 1B is a schematic, cross-sectional view of a single-poly NVM cell in accordance with one embodiment of the invention, wherein the read transistor is NMOS.

FIG. 1B is a partial, schematic, cross-sectional view of a single-poly NVM cell having an NMOS read transistor. As shown in FIG. 1B, according to another embodiment, the read transistor 20 of the single-poly NVM cell 1b may be an NMOS transistor formed in the ion well 12 of P type (PW) that may be electrically connected to a P well voltage ($V_{PW}$) through a P+ contact region 120. Likewise, the single-poly NVM cell 1b further includes a coupling capacitor 30. The coupling capacitor 30 is formed within the second OD region 104. The coupling capacitor 30 comprises a shallow ion well 320 of the second conductivity type, a heavily-doped, ultra-shallow dopant region 310 in the shallow ion well 320 of the second conductivity type, a contact region 304 in the heavily-doped, ultra-shallow dopant region 310, a charge storage floating gate 306 formed of a single polycrystalline silicon layer overlying the heavily-doped, ultra-shallow dopant region 310, and a gate dielectric layer 308 between the charge storage floating gate 306 and heavily-doped, ultra-shallow dopant region 310.

According to the embodiment, the shallow ion well 320 of the second conductivity type may be a shallow N well, the heavily-doped, ultra-shallow dopant region 310 may be a P+ or N+ ultra-shallow dopant region, and the contact region 304 may be a P+ or N+ contact region. It is noteworthy that the shallow ion well 320 of the second conductivity type is formed directly within the semiconductor substrate 10, and is not formed within any ion well. A PN junction 311 between the shallow ion well 320 of the second conductivity type and the heavily-doped, ultra-shallow dopant region 310 has a junction depth $d_2$ that is shallower than the trench depth $d_1$ of the STI regions 110a and 110b.

According to the embodiment, the charge storage floating gate 306 of the coupling capacitor 30 is electrically coupled to the floating gate 206 of the read transistor 20. The P+ contact region 304, the heavily-doped, ultra-shallow dopant region 310, and the shallow ion well 320 of the second conductivity type (shallow N well or shallow N−) may be commonly connected to a control gate voltage ($V_{CG}$). The shallow ion well 320 of the second conductivity type and the heavily-doped, ultra-shallow dopant region 310 may be electrically coupled to $V_{CG}$ through the contact region 304 formed within the ultra-shallow dopant region 310. The gate dielectric layers 208 and 308 are made of the same material and have the same thickness as that used in the logic circuitry on the same integrated circuit chip.

Table 1 below shows the exemplary operating conditions for the single-poly NVM cell 1b in FIG. 1B.

TABLE 1

|  | $V_{CG}$ | $V_D$ | $V_S$ | $V_{PW}$ |
| --- | --- | --- | --- | --- |
| Program (Channel Hot Electron Injection) | 8V | 7V | 0V | 0V |
| Erase (FN tunneling) | −5V | 8V | 8V | 0V |
| Erase (Hot Hole Injection) | −3V | 7V | 0V | 0V |
| Erase (Hot Hole Injection) | 0~2V | 7V | 0V | 0V |

In program (write) operation, for example, the shallow ion well 320 (shallow N−) and the heavily-doped, ultra-shallow dopant region 310 (shallow P+) are electrically coupled to $V_{CS}$=8V through the contact region 304. The drain region 202 of the read transistor 20 is electrically coupled to drain voltage $V_D$=7V. The source region 204 of the read transistor 20 is electrically coupled to source voltage $V_S$=0V. The P well 12 is electrically coupled to P well voltage $V_{PW}$=0V through the P+ contact region 120. Under such condition, the memory cell 1b is programmed by Channel Hot Electron Injection.

In erase operation, for example, the shallow ion well 320 (shallow N−) and the heavily-doped, ultra-shallow dopant region 310 (shallow P+) are electrically coupled to $V_{CG}$=−5V through the contact region 304. The drain region 202 of the read transistor 20 is electrically coupled to drain voltage $V_D$=8V. The source region 204 of the read transistor 20 is electrically coupled to source voltage $V_S$=8V. The P well 12 is electrically coupled to P well voltage $V_{PW}$=0V through the P+ contact region 120. Under such condition, the memory cell 1b is erased by FN tunneling.

In erase operation, for example, the shallow ion well 320 (shallow N−) and the heavily-doped, ultra-shallow dopant region 310 (shallow P+) are electrically coupled to $V_{CG}$=−3V through the contact region 304. The drain region 202 of the read transistor 20 is electrically coupled to drain voltage $V_D$=7V. The source region 204 of the read transistor 20 is electrically coupled to source voltage $V_S$=0V. The P well 12 is electrically coupled to P well voltage $V_{PW}$=0V through the P+ contact region 120. Under such condition, the memory cell 1b is erased by Hot Hole Injection.

In erase operation, for example, the shallow ion well 320 (shallow N−) and the heavily-doped, ultra-shallow dopant region 310 (shallow P+) are electrically coupled to $V_{CG}$=0-2V through the contact region 304. The drain region 202 of the read transistor 20 is electrically coupled to drain voltage $V_D$=7V. The source region 204 of the read transistor 20 is electrically coupled to source voltage $V_S$=0V. The P well 12 is electrically coupled to P well voltage $V_{PW}$=0V through the P+ contact region 120. Under such condition, the memory cell 1b is erased by Hot Hole Injection.

Figure 2A:
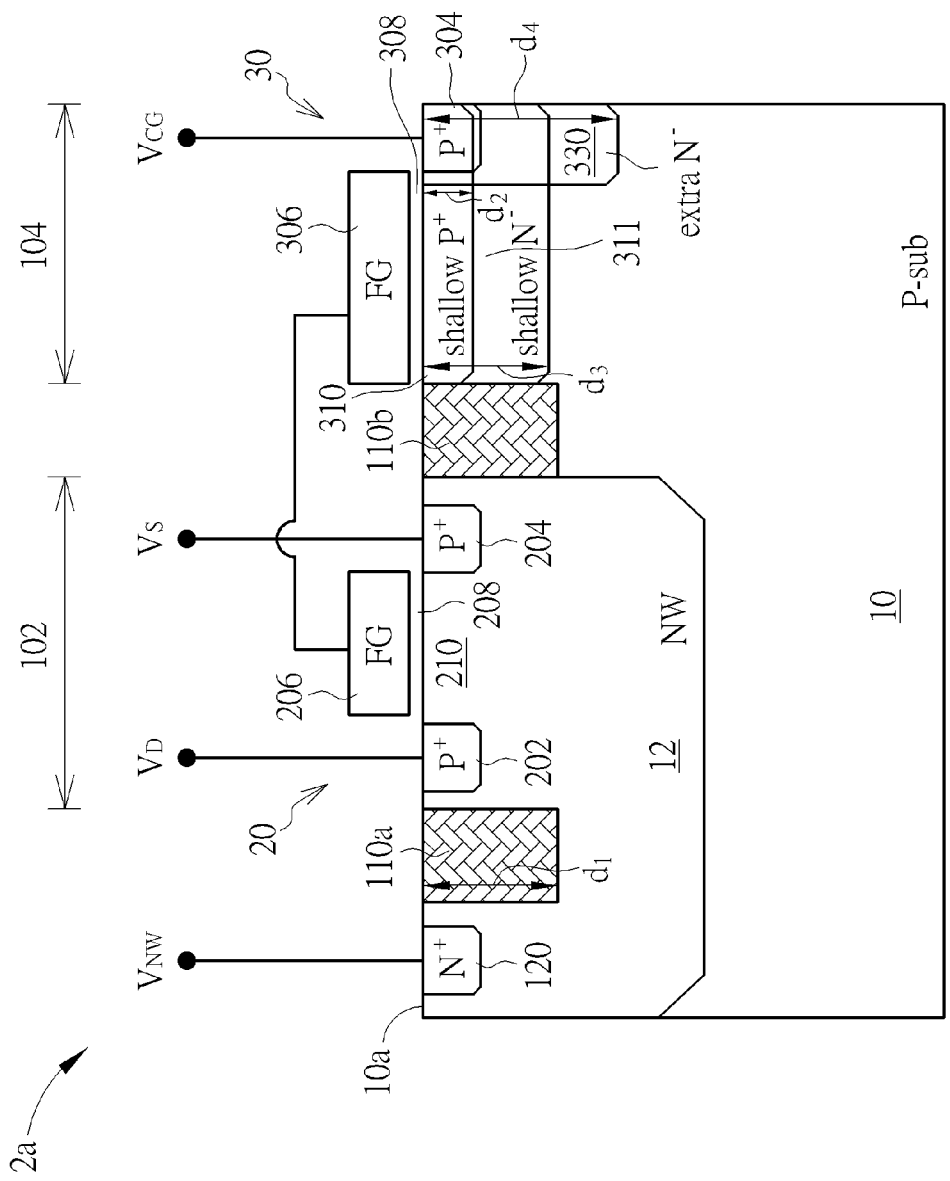
FIG. 2A is a partial, schematic, cross-sectional view of a single-poly NVM cell in accordance with another embodiment of the invention, wherein the read transistor is PMOS, and the coupling capacitor comprises an extra $N^-$ region to enclose the $P^+$ contact region.

FIG. 2A is a partial, schematic, cross-sectional view of a single-poly NVM cell in accordance with another embodiment of the invention. As shown in FIG. 2A, the single-poly NVM cell 2a comprises a semiconductor substrate 10 having a first conductivity type. For example, the semiconductor substrate 10 may be a P-type silicon substrate (P-Sub) according to the embodiment. An ion well 12 of a second conductivity type is formed in a major surface 10a of the semiconductor substrate 10. For example, the ion well 12 of the second conductivity type may be an N well (NW) according to the embodiment. The ion well 12 of the second conductivity type may be electrically coupled to $V_{NW}$ through an N+ contact region 120 formed within the ion well 12 of the second conductivity type.

Likewise, STI regions 110a and 110b are formed in the major surface 10a of the semiconductor substrate 10. The STI region 110b separates two OD regions: the first OD region 102 and the second OD region 104. The STI regions 110a and 110b extend into the semiconductor substrate 10 to a trench depth $d_1$ that is shallower than the junction depth of the ion well 12. For example, the trench depth d1 may range between 0.1 micrometers and 1.0 micrometers.

A read transistor 20 is formed within the first OD region 102. According to the embodiment, the read transistor 20 is a PMOS transistor and may comprise a P+ drain region 202, a P+ source region 204, a channel region 210 between the P+ drain region 202 and the P+ source region 204, a floating gate 206 formed of a single polycrystalline silicon layer overlying the channel region 210, and a gate dielectric layer 208 between the floating gate 206 and the channel region 210. The P+ drain region 202 is separated from the N+ contact region 120 by the STI region 110a. According to the embodiment, the gate dielectric layer 208 is made of the same material and has the same thickness as that used in the logic circuitry on the same integrated circuit chip. The P+ drain region 202 may be electrically coupled to a drain voltage ($V_D$) and the P+ source region 204 may be electrically coupled to a source voltage ($V_S$).

A coupling capacitor 30 is formed within the second OD region 104. According to the embodiment, the coupling capacitor 30 may comprise a shallow ion well 320 of the second conductivity type, a heavily-doped, ultra-shallow dopant region 310 in the shallow ion well 320 of the second conductivity type, a contact region 304 in the heavily-doped, ultra-shallow dopant region 310, a charge storage floating gate 306 formed of a single polycrystalline silicon layer overlying the heavily-doped, ultra-shallow dopant region 310, and a gate dielectric layer 308 between the charge storage floating gate 306 and heavily-doped, ultra-shallow dopant region 310.

According to the embodiment, the shallow ion well 320 of the second conductivity type may be a shallow N well, the heavily-doped, ultra-shallow dopant region 310 may be a P+ or N+ ultra-shallow dopant region, and the contact region 304 may be a P+ or N+ contact region. It is noteworthy that the shallow ion well 320 of the second conductivity type is formed directly within the semiconductor substrate 10, and is not formed within an ion well such as an N well or P well. A PN junction 311 between the shallow ion well 320 of the second conductivity type and the heavily-doped, ultra-shallow dopant region 310 has a junction depth $d_2$ that is shallower than the trench depth $d_1$ of the STI regions 110a and 110b. The junction depth $d_2$ is even shallower than the NP junction depth of the P+ drain region 202, the P+ source region 204, and the P+ contact region 304.

It is to be understood that according to another embodiment, the heavily-doped, ultra-shallow dopant region 310 and the contact region 304 may both have the second conductivity type as that of the shallow ion well 320. For example, the shallow ion well 320 may be a shallow N well, the heavily-doped, ultra-shallow dopant region 310 may be an N+ ultra-shallow dopant region, and the contact region 304 may be an N+ contact region.

The single-poly NVM cell 2a further comprises an extra N− region 330 encompassing the P+ contact region 304. The extra N− region 330 has a junction depth d4 that is deeper than d3. The extra N− region 330 overlaps with a right portion of the shallow ion well 320. That is, the extra N− region 330 partially overlaps with the shallow ion well 320 and the heavily-doped, ultra-shallow dopant region 310. The extra N− region 330 increases breakdown voltage of the memory device.

According to the embodiment, the charge storage floating gate 306 of the coupling capacitor 30 is electrically coupled to the floating gate 206 of the read transistor 20. The P+ contact region 304, the heavily-doped, ultra-shallow dopant region 310 (shallow P+), and the shallow ion well 320 of the second conductivity type (shallow N well or shallow N−) may be commonly connected to a control gate voltage ($V_{CG}$). The shallow ion well 320 of the second conductivity type and the heavily-doped, ultra-shallow dopant region 310 (shallow P+) may be electrically coupled to $V_{CG}$ through the P+ contact region 304 formed within the ultra-shallow dopant region 310 (shallow P+). The gate dielectric layers 208 and 308 are made of the same material and have the same thickness as that used in the logic circuitry on the same integrated circuit chip. An additional layer or photomask may be added to the current single-poly logic process in order to form the shallow ion well 320 of the second conductivity type and the heavily-doped, ultra-shallow dopant region 310 (shallow P+).

It is to be understood that although not shown in the figures, a pair of sidewall spacers may be formed on the opposite sidewalls of each of the floating gates 206 and 306, and a lightly doped drain (LDD) regions may be formed under the sidewall spacers.

The P+ drain region 202, the P+ source region 204, the P+ contact region 304 have substantially the same NP junction depth. The shallow ion well 320 has a junction depth $d_3$. According to the embodiment, the junction depth $d_3$ is deeper than the junction depth $d_2$ and is substantially equal to or shallower than the trench depth $d_1$ of the STI regions 110a and 110b. According to the embodiment, the multi-well scheme (shallow P+ 310/shallow N− 320/P-Sub 10) directly under the charge storage floating gate 306 may serve as a charge pumping element. The heavily-doped, ultra-shallow dopant region 310 (shallow P+) enhances the coupling ratio of the single-poly NVM cell 2a.

To form such multi-well scheme (shallow P+ 310/shallow N− 320/extra N−/P-Sub 10), a patterned implant mask layer (not shown) may be formed on the semiconductor substrate 10 to reveal the second OD region 104. A first ion implantation process may be carried out to implant N type dopants into the second OD region 104 to form the shallow N− 320. A second ion implantation process is then carried out to implant P type dopants into the second OD region 104 to form the shallow P+ 310. Thereafter, a thermal oxidation process is performed to form the gate dielectric layer 308. An etch-back process may be performed to remove an upper portion of the gate dielectric layer 308. By thinning down the thickness of the gate dielectric layer 308, the coupling ratio of the memory cell is increased. Subsequently, a third ion implantation process is carried out to implant N type dopants into the second OD region 104 to form the extra N− region 330. The third ion implantation process may be carried out after the formation of the charge storage floating gate 306 and may be self-aligned to the edge of the charge storage floating gate 306.

According to another embodiment, to form such multi-well scheme (shallow P+ 310/shallow N− 320/extra N−/P-Sub 10), a patterned implant mask layer (not shown) may be formed on the semiconductor substrate 10 to reveal the second OD region 104. A first ion implantation process may be carried out to implant N type dopants into the second OD region 104 to form the shallow N− 320. A second ion implantation process is then carried out to implant P type dopants into the second OD region 104 to form a shallow P− (not shown). Thereafter, a thermal oxidation process is performed to form the gate dielectric layer 308. After the formation of the gate dielectric layer 308, a third ion implantation process is carried out to implant P type dopants into the second OD region 104 to form a shallow P+ 310. The heavily doped shallow P+ 310 helps increase the coupling ratio. Subsequently, a fourth ion implantation process is carried out to implant N type dopants into the second OD region 104 to form the extra N− region 330. The fourth ion implantation process may be carried out after the formation of the charge storage floating gate 306 and may be self-aligned to the edge of the charge storage floating gate 306.

According to still another embodiment, the shallow P+ 310 and shallow N− 320 may be formed after the formation of the gate dielectric layer 308. For example, a thermal oxidation process is first performed to form the gate dielectric layer 308. A first ion implantation process may be carried out to implant N type dopants into the second OD region 104 to form the shallow N− 320. A second ion implantation process is then carried out to implant P type dopants into the second OD region 104 to form the shallow P+ 310. Subsequently, a third ion implantation process is carried out to implant N type dopants into the second OD region 104 to form the extra N− region 330.

It should be recognized that although the present invention has been illustrated schematically with the use of certain conductivity types, the opposite conductive types can also be implemented.

Figure 2B:
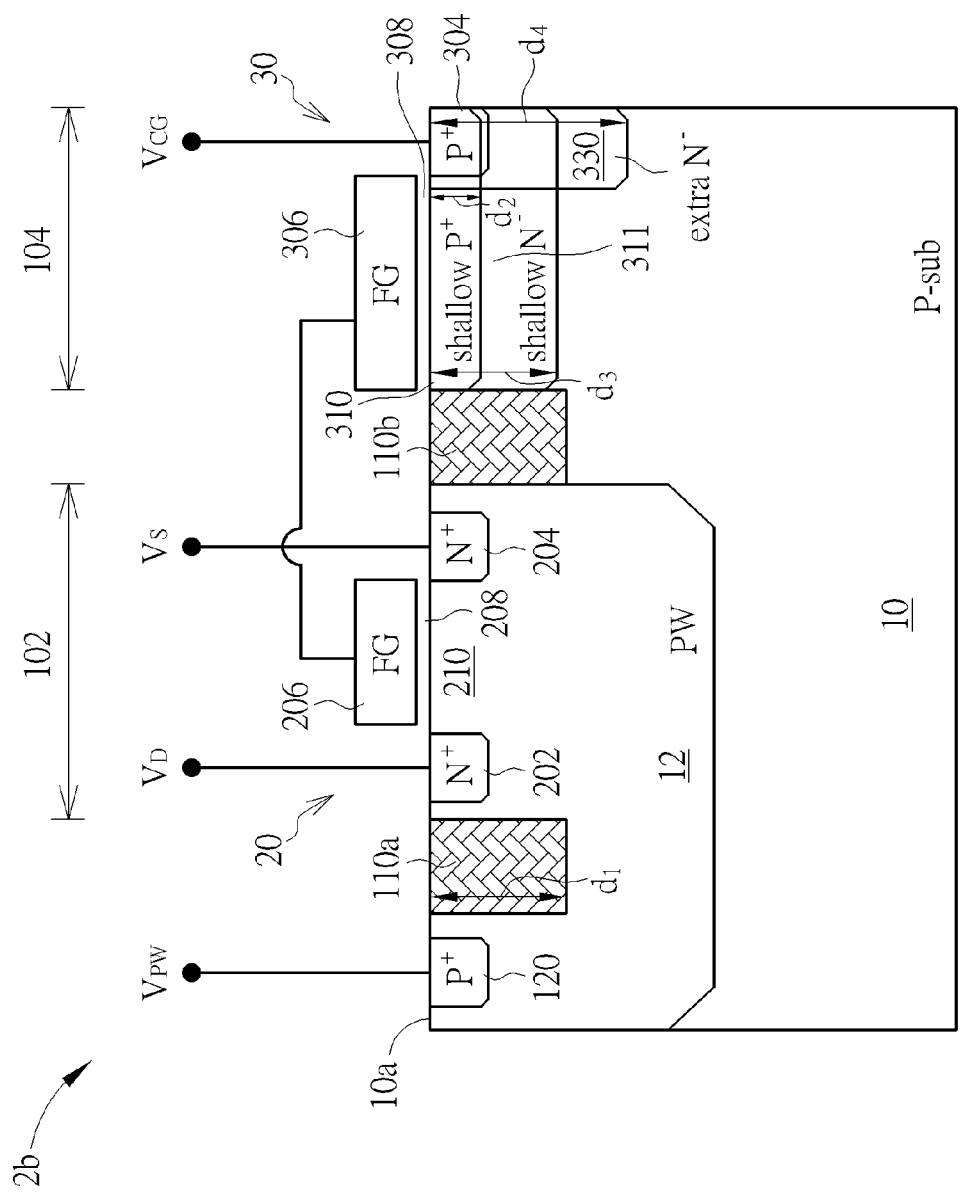
FIG. 2B is a partial, schematic, cross-sectional view of a single-poly NVM cell in accordance with another embodiment of the invention, wherein the read transistor is NMOS.

FIG. 2B is a partial, schematic, cross-sectional view of a single-poly NVM cell having an NMOS read transistor. As shown in FIG. 2B, according to another embodiment, the read transistor 20 of the single-poly NVM cell 2b may be an NMOS transistor formed in the ion well 12 of P type (PW) that may be electrically connected to a P well voltage ($V_{PW}$) through a P+ contact region 120. Likewise, the single-poly NVM cell 2b further includes a coupling capacitor 30. The coupling capacitor 30 is formed within the second OD region 104. The coupling capacitor 30 comprises a shallow ion well 320 of the second conductivity type, a heavily-doped, ultra-shallow dopant region 310 in the shallow ion well 320 of the second conductivity type, a contact region 304 in the heavily-doped, ultra-shallow dopant region 310, a charge storage floating gate 306 formed of a single polycrystalline silicon layer overlying the heavily-doped, ultra-shallow dopant region 310, and a gate dielectric layer 308 between the charge storage floating gate 306 and heavily-doped, ultra-shallow dopant region 310.

According to the embodiment, the shallow ion well 320 of the second conductivity type may be a shallow N well, the heavily-doped, ultra-shallow dopant region 310 may be a P+ or N+ ultra-shallow dopant region, and the contact region 304 may be a P+ or N+ contact region. It is noteworthy that the shallow ion well 320 of the second conductivity type is formed directly within the semiconductor substrate 10, and is not formed within any ion well. A PN junction 311 between the shallow ion well 320 of the second conductivity type and the heavily-doped, ultra-shallow dopant region 310 has a junction depth $d_2$ that is shallower than the trench depth $d_1$ of the STI regions 110a and 110b.

According to the embodiment, the charge storage floating gate 306 of the coupling capacitor 30 is electrically coupled to the floating gate 206 of the read transistor 20. The P+ contact region 304, the heavily-doped, ultra-shallow dopant region 310, and the shallow ion well 320 of the second conductivity type (shallow N well or shallow N−) may be commonly connected to a control gate voltage ($V_{CG}$). The shallow ion well 320 of the second conductivity type and the heavily-doped, ultra-shallow dopant region 310 may be electrically coupled to $V_{CG}$ through the contact region 304 formed within the ultra-shallow dopant region 310. The gate dielectric layers 208 and 308 are made of the same material and have the same thickness as that used in the logic circuitry on the same integrated circuit chip.

Figure 3A:
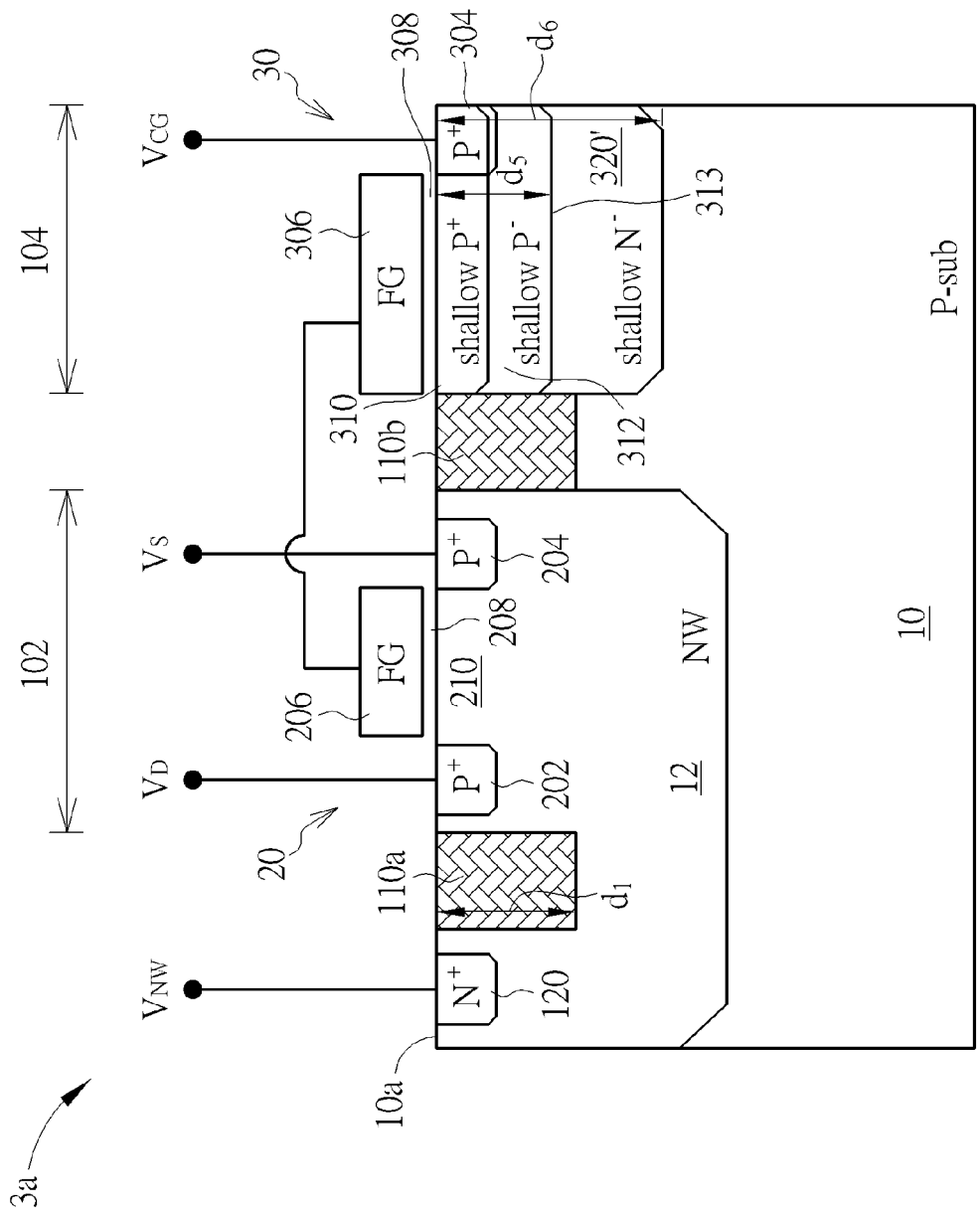
FIG. 3A is a partial, schematic, cross-sectional view of a single-poly NVM cell in accordance with another embodiment of the invention, wherein the read transistor is PMOS, and the coupling capacitor comprises a multi-well scheme (shallow $P^+$/shallow $P^-$/shallow $N^-$/P-Sub)

FIG. 3A is a partial, schematic, cross-sectional view of a single-poly NVM cell in accordance with yet another embodiment of the invention. As shown in FIG. 3A, the single-poly NVM cell 3a comprises a semiconductor substrate 10 having a first conductivity type. For example, the semiconductor substrate 10 may be a P-type silicon substrate (P-Sub) according to the embodiment. An ion well 12 of a second conductivity type is formed in a major surface 10a of the semiconductor substrate 10. For example, the ion well 12 of the second conductivity type may be an N well (NW) according to the embodiment. The ion well 12 of the second conductivity type may be electrically coupled to $V_{NW}$ through an N+ contact region 120 formed within the ion well 12 of the second conductivity type.

Likewise, STI regions 110a and 110b are formed in the major surface 10a of the semiconductor substrate 10. The STI region 110b separates two oxide-define (OD) regions or active areas: the first OD region 102 and the second OD region 104. The STI regions 110a and 110b extend into the semiconductor substrate 10 to a trench depth $d_1$ that is shallower than the junction depth of the ion well 12. For example, the trench depth $d_1$ may range between 0.1 micrometers and 1.0 micrometers.

A read transistor 20 is formed within the first OD region 102. According to the embodiment, the read transistor 20 is a PMOS transistor and may comprise a P+ drain region 202, a P+ source region 204, a channel region 210 between the P+ drain region 202 and the P+ source region 204, a floating gate 206 formed of a single polycrystalline silicon layer overlying the channel region 210, and a gate dielectric layer 208 between the floating gate 206 and the channel region 210. The P+ drain region 202 is separated from the N+ contact region 120 by the STI region 110a. According to the embodiment, the gate dielectric layer 208 is made of the same material and has the same thickness as that used in the logic circuitry on the same integrated circuit chip. The P+ drain region 202 may be electrically coupled to a drain voltage ($V_D$) and the P+ source region 204 may be electrically coupled to a source voltage ($V_S$).

A coupling capacitor 30 is formed within the second OD region 104. According to the embodiment, the coupling capacitor 30 may comprise a shallow ion well 320' of the second conductivity type, a heavily-doped, ultra-shallow dopant region 310, a contact region 304 in the heavily-doped, ultra-shallow dopant region 310, and a lightly-doped dopant region 312 of the first conductivity type. The heavily-doped, ultra-shallow dopant region 310 is formed within the lightly-doped dopant region 312 of the first conductivity type. A charge storage floating gate 306 formed of a single polycrystalline silicon layer overlies the heavily-doped, ultra-shallow dopant region 310. A gate dielectric layer 308 is provided between the charge storage floating gate 306 and heavily-doped, ultra-shallow dopant region 310.

According to the embodiment, the shallow ion well 320' of the second conductivity type may be a shallow N well, the heavily-doped, ultra-shallow dopant region 310 may be a P+ or N+ ultra-shallow dopant region, and the contact region 304 of the first conductivity type may be a P+ or N+ contact region. It is noteworthy that the shallow ion well 320' of the second conductivity type is formed directly within the semiconductor substrate 10, and is not formed within an ion well of the second conductivity type such as an N well. A PN junction 313 between the shallow ion well 320' of the second conductivity type and the lightly-doped dopant region 312 of the first conductivity type has a junction depth d5 that is shallower than the trench depth d1 of the STI regions 110a and 110b.

It is to be understood that according to another embodiment, the heavily-doped, ultra-shallow dopant region 310 may have the second conductivity type as that of the shallow ion well 320'. For example, the shallow ion well 320' may be a shallow N well, the heavily-doped and the ultra-shallow dopant region 310 may be an N+ ultra-shallow dopant region.

According to the embodiment, the charge storage floating gate 306 of the coupling capacitor 30 is electrically coupled to the floating gate 206 of the read transistor 20. The P+ contact region 304, the heavily-doped, ultra-shallow dopant region 310 (shallow P+), the lightly-doped dopant region 312 of the first conductivity type (shallow P−), and the shallow ion well 320' of the second conductivity type (shallow N well or shallow N−) may be commonly connected to a control gate voltage (VCG). The shallow ion well 320' of the second conductivity type and the heavily-doped, ultra-shallow dopant region 310 (shallow P+) may be electrically coupled to VCG through the P+ contact region 304 formed within the ultra-shallow dopant region 310 of the first conductivity type (shallow P+). The gate dielectric layers 208 and 308 are made of the same material and have the same thickness as that used in the logic circuitry on the same integrated circuit chip. An additional layer or photomask may be added to the current single-poly logic process in order to form the shallow ion well 320' of the second conductivity type, the heavily-doped, ultra-shallow dopant region 310 (shallow P+), and the lightly-doped dopant region 312 of the first conductivity type.

It is to be understood that although not shown in the figures, a pair of sidewall spacers may be formed on the opposite sidewalls of each of the floating gates 206 and 306, and a lightly doped drain (LDD) regions may be formed under the sidewall spacers.

The P+ drain region 202, the P+ source region 204, the P+ contact region 304 have substantially the same NP junction depth. The shallow ion well 320' has a junction depth d6. According to the embodiment, the junction depth d6 is deeper than the junction depth d5 and is deeper than the trench depth d1 of the STI regions 110a and 110b, while shallower than the junction depth of the ion well 12. According to the embodiment, the multi-well scheme (shallow P+ 310/shallow N− 320/shallow P− 312/P-Sub 10) directly under the charge storage floating gate 306 may serve as a charge pumping element. The heavily-doped, ultra-shallow dopant region 310 (shallow P+) enhances the coupling ratio of the single-poly NVM cell 3a.

To form such multi-well scheme (shallow P+ 310/shallow P− 312/shallow N− 320/P-Sub 10), a patterned implant mask layer (not shown) may be formed on the semiconductor substrate 10 to reveal the second OD region 104. A first ion implantation process may be carried out to implant N type dopants into the second OD region 104 to form the shallow N− 320. A second ion implantation process is then carried out to implant P type dopants into the second OD region 104 to form the shallow P− 312. A third ion implantation process is then carried out to implant P type dopants into the second OD region 104 to form the shallow P+ 310. Thereafter, a thermal oxidation process is performed to form the gate dielectric layer 308. An etch-back process may be performed to remove an upper portion of the gate dielectric layer 308. By thinning down the thickness of the gate dielectric layer 308, the coupling ratio of the memory cell is increased.

According to another embodiment, to form such multi-well scheme (shallow P+ 310/shallow P− 312/shallow N− 320/P-Sub 10), a patterned implant mask layer (not shown) may be formed on the semiconductor substrate 10 to reveal the second OD region 104. A first ion implantation process may be carried out to implant N type dopants into the second OD region 104 to form the shallow N− 320. A second ion implantation process is then carried out to implant P type dopants into the second OD region 104 to form the shallow P− 312. Thereafter, a thermal oxidation process is performed to form the gate dielectric layer 308. After the formation of the gate dielectric layer 308, a third ion implantation process is carried out to implant P type dopants into the second OD region 104 to form a shallow P+ 310. The heavily doped shallow P+ 310 helps increase the coupling ratio.

According to still another embodiment, the shallow P+ 310, the shallow P− 312 and shallow N− 320 may be formed after the formation of the gate dielectric layer 308. For example, a thermal oxidation process is first performed to form the gate dielectric layer 308. A first ion implantation process may be carried out to implant N type dopants into the second OD region 104 to form the shallow N− 320. A second and third ion implantation processes are then carried out to implant P type dopants into the second OD region 104 to form the shallow P+ 310 and the shallow P− 312.

It should be recognized that although the present invention has been illustrated schematically with the use of certain conductivity types, the opposite conductive types can also be implemented.

Figure 3B:
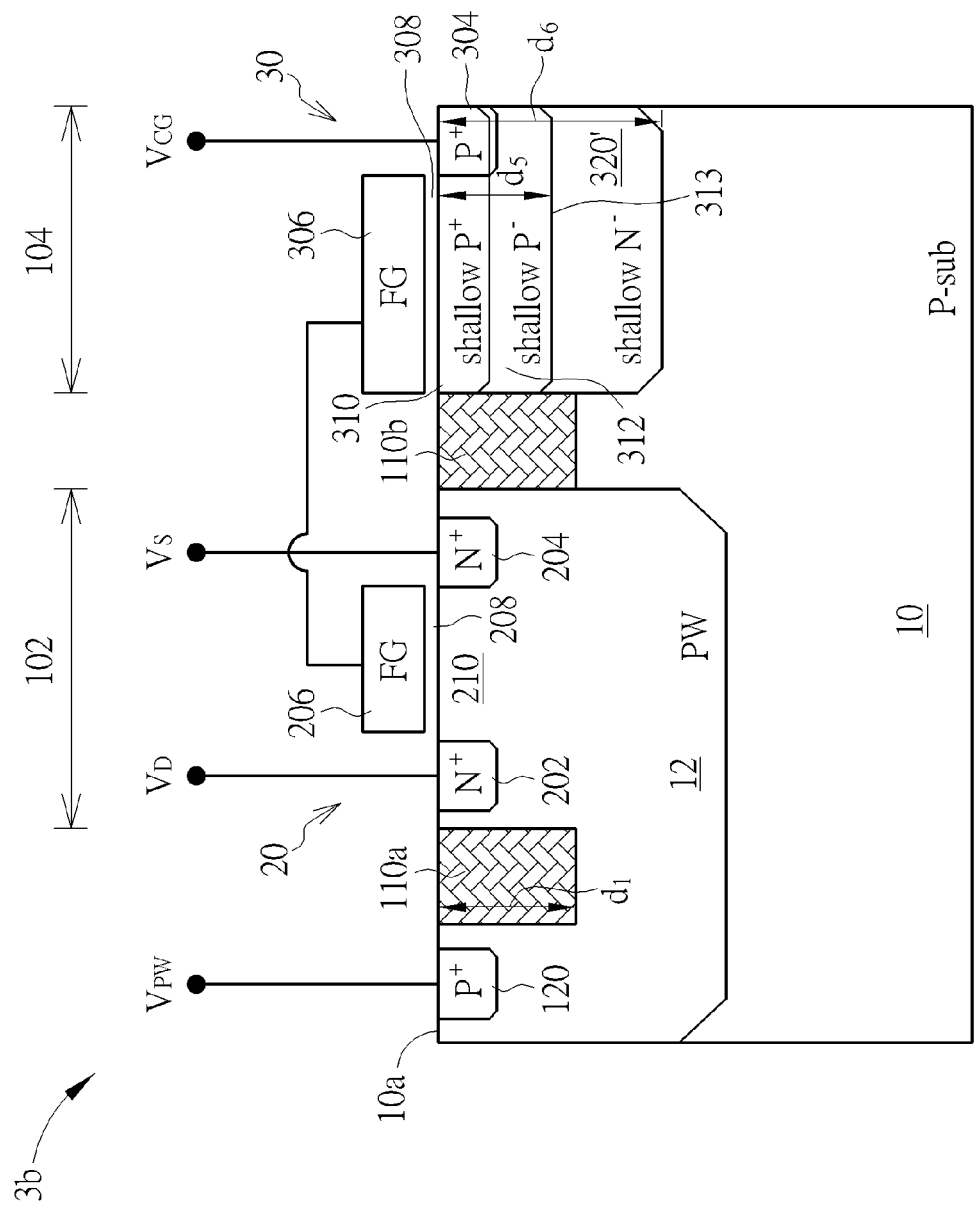
FIG. 3B is a partial, schematic, cross-sectional view of a single-poly NVM cell in accordance with another embodiment of the invention, wherein the read transistor is NMOS.

FIG. 3B is a partial, schematic, cross-sectional view of a single-poly NVM cell having an NMOS read transistor. As shown in FIG. 3B, according to another embodiment, the read transistor 20 of the single-poly NVM cell 3b may be an NMOS transistor formed in the ion well 12 of P type (PW) that may be electrically connected to a P well voltage ($V_{PW}$) through a P+ contact region 120. Likewise, the single-poly NVM cell 3b further includes a coupling capacitor 30. The coupling capacitor 30 is formed within the second OD region 104. The coupling capacitor 30 comprises a shallow ion well 320' of the second conductivity type, a heavily-doped, ultra-shallow dopant region 310 in the shallow ion well 320' of the second conductivity type, a lightly-doped dopant region 312 of the first conductivity type, a contact region 304 in the heavily-doped, ultra-shallow dopant region 310, a charge storage floating gate 306 formed of a single polycrystalline silicon layer overlying the heavily-doped, ultra-shallow dopant region 310, and a gate dielectric layer 308 between the charge storage floating gate 306 and heavily-doped, ultra-shallow dopant region 310.

According to the embodiment, the shallow ion well 320' of the second conductivity type may be a shallow N well, the heavily-doped, ultra-shallow dopant region 310 may be a P+ or N+ ultra-shallow dopant region, the lightly-doped dopant region 312 of the first conductivity type is a P− dopant region, and the contact region 304 may be a P+ or N+ contact region. It is noteworthy that the shallow ion well 320' of the second conductivity type is formed directly within the semiconductor substrate 10, and is not formed within any ion well. A PN junction 313 between the shallow ion well 320' of the second conductivity type and the lightly-doped dopant region 312 of the first conductivity type has a junction depth $d_5$ that is shallower than the trench depth $d_1$ of the STI regions 110a and 110b.

According to the embodiment, the charge storage floating gate 306 of the coupling capacitor 30 is electrically coupled to the floating gate 206 of the read transistor 20. The P+ contact region 304, the heavily-doped, ultra-shallow dopant region 310, the lightly-doped dopant region 312 of the first conductivity type, and the shallow ion well 320' of the second conductivity type (shallow N well or shallow N−) may be commonly connected to a control gate voltage ($V_{CG}$). The shallow ion well 320' of the second conductivity type and the heavily-doped, ultra-shallow dopant region 310 may be electrically coupled to $V_{CG}$ through the contact region 304 formed within the ultra-shallow dopant region 310. The gate dielectric layers 208 and 308 are made of the same material and have the same thickness as that used in the logic circuitry on the same integrated circuit chip.

Figure 4A:
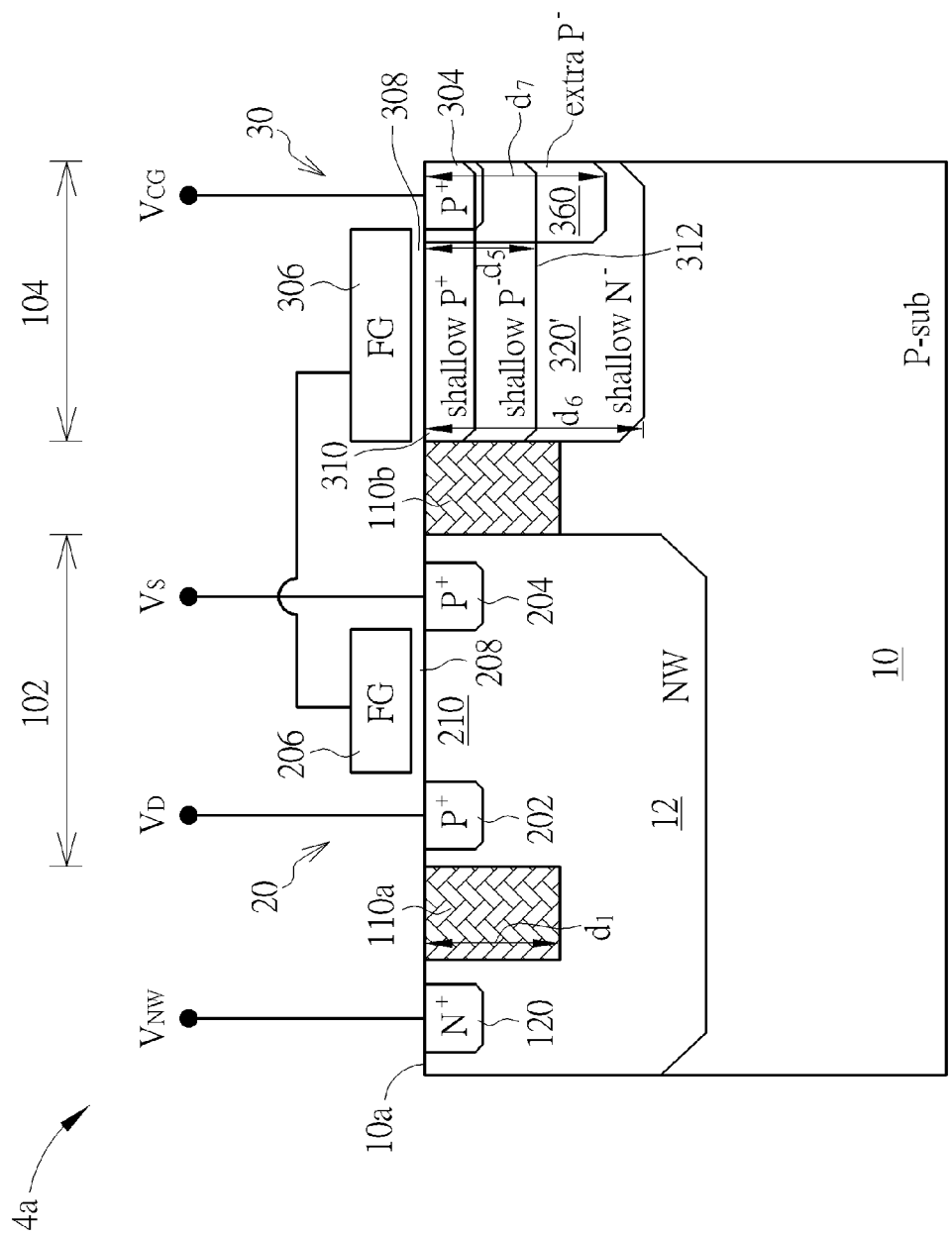
FIG. 4A is a partial, schematic, cross-sectional view of a single-poly NVM cell in accordance with yet another embodiment of the invention, wherein the read transistor is NMOS, and the coupling capacitor comprises a multi-well scheme (shallow $P^+$/shallow $P^-$/shallow $N^-$/P-Sub) with an extra $P^-$ region encompassing the $P^+$ contact region.

FIG. 4A is a partial, schematic, cross-sectional view of a single-poly NVM cell in accordance with yet another embodiment of the invention. As shown in FIG. 4A, the single-poly NVM cell 4a comprises a semiconductor substrate 10 having a first conductivity type. For example, the semiconductor substrate 10 may be a P-type silicon substrate (P-Sub) according to the embodiment. An ion well 12 of a second conductivity type is formed in a major surface 10a of the semiconductor substrate 10. For example, the ion well 12 of the second conductivity type may be an N well (NW) according to the embodiment. The ion well 12 of the second conductivity type may be electrically coupled to $V_{NW}$ through an N+ contact region 120 formed within the ion well 12 of the second conductivity type.

Likewise, STI regions 110a and 110b are formed in the major surface 10a of the semiconductor substrate 10. The STI region 110b separates two oxide-define (OD) regions or active areas: the first OD region 102 and the second OD region 104. The STI regions 110a and 110b extend into the semiconductor substrate 10 to a trench depth $d_1$ that is shallower than the junction depth of the ion well 12. For example, the trench depth $d_1$ may range between 0.1 micrometers and 1.0 micrometers.

A read transistor 20 is formed within the first OD region 102. According to the embodiment, the read transistor 20 is a PMOS transistor and may comprise a P+ drain region 202, a P+ source region 204, a channel region 210 between the P+ drain region 202 and the P+ source region 204, a floating gate 206 formed of a single polycrystalline silicon layer overlying the channel region 210, and a gate dielectric layer 208 between the floating gate 206 and the channel region 210. The P+ drain region 202 is separated from the N+ contact region 120 by the STI region 110a. According to the embodiment, the gate dielectric layer 208 is made of the same material and has the same thickness as that used in the logic circuitry on the same integrated circuit chip. The P+ drain region 202 may be electrically coupled to a drain voltage ($V_D$) and the P+ source region 204 may be electrically coupled to a source voltage ($V_S$).

A coupling capacitor 30 is formed within the second OD region 104. According to the embodiment, the coupling capacitor 30 may comprise a shallow ion well 320' of the second conductivity type, a heavily-doped, ultra-shallow dopant region 310, a contact region 304 in the heavily-doped, ultra-shallow dopant region 310, and a lightly-doped dopant region 312 of the first conductivity type. The heavily-doped, ultra-shallow dopant region 310 is formed within the lightly-doped dopant region 312 of the first conductivity type. A charge storage floating gate 306 formed of a single polycrystalline silicon layer overlies the heavily-doped, ultra-shallow dopant region 310. A gate dielectric layer 308 is provided between the charge storage floating gate 306 and heavily-doped, ultra-shallow dopant region 310.

According to the embodiment, the shallow ion well 320' of the second conductivity type may be a shallow N well, the heavily-doped, ultra-shallow dopant region 310 may be a P+ or N+ ultra-shallow dopant region, and the contact region 304 of the first conductivity type may be a P+ or N+ contact region. It is noteworthy that the shallow ion well 320' of the second conductivity type is formed directly within the semiconductor substrate 10, and is not formed within an ion well of the second conductivity type such as an N well. A PN junction 313 between the shallow ion well 320' of the second conductivity type and the lightly-doped dopant region 312 of the first conductivity type has a junction depth $d_5$ that is shallower than the trench depth $d_1$ of the STI regions 110a and 110b.

The single-poly NVM cell 4a further comprises an extra P− region 360 encompassing the P+ contact region 304. The extra P− region 360 has a junction depth $d_7$ that is deeper than $d_5$. The extra P− region 360 overlaps with a right portion of the lightly-doped dopant region 312 of the first conductivity type. The extra P− region 360 increases breakdown voltage of the memory device.

It is to be understood that according to another embodiment, the heavily-doped, ultra-shallow dopant region 310 may have the second conductivity type as that of the shallow ion well 320'. For example, the shallow ion well 320' may be a shallow N well, the heavily-doped and the ultra-shallow dopant region 310 may be an N+ ultra-shallow dopant region.

According to the embodiment, the charge storage floating gate 306 of the coupling capacitor 30 is electrically coupled to the floating gate 206 of the read transistor 20. The P+ contact region 304, the heavily-doped, ultra-shallow dopant region 310 (shallow P+), the lightly-doped dopant region 312 of the first conductivity type (shallow P−), the extra P− region 360, and the shallow ion well 320' of the second conductivity type (shallow N well or shallow N−) may be commonly connected to a control gate voltage ($V_{CG}$). The shallow ion well 320' of the second conductivity type and the heavily-doped, ultra-shallow dopant region 310 (shallow P$^+$) may be electrically coupled to $V_{CG}$ through the P$^+$ contact region 304 formed within the ultra-shallow dopant region 310 of the first conductivity type (shallow P$^+$). The gate dielectric layers 208 and 308 are made of the same material and have the same thickness as that used in the logic circuitry on the same integrated circuit chip. An additional layer or photomask may be added to the current single-poly logic process in order to form the shallow ion well 320' of the second conductivity type, the heavily-doped, ultra-shallow dopant region 310 (shallow P$^+$), and the lightly-doped dopant region 312 of the first conductivity type.

It is to be understood that although not shown in the figures, a pair of sidewall spacers may be formed on the opposite sidewalls of each of the floating gates 206 and 306, and a lightly doped drain (LDD) regions may be formed under the sidewall spacers.

The P$^+$ drain region 202, the P$^+$ source region 204, the P$^+$ contact region 304 have substantially the same NP junction depth. The shallow ion well 320' has a junction depth $d_6$. According to the embodiment, the junction depth $d_6$ is deeper than the junction depth $d_5$ and is deeper than the trench depth $d_1$ of the STI regions 110a and 110b, while shallower than the junction depth of the ion well 12. According to the embodiment, the multi-well scheme (shallow P$^+$ 310/shallow N$^-$ 320/shallow P$^-$ 312/P-Sub 10) directly under the charge storage floating gate 306 may serve as a charge pumping element. The heavily-doped, ultra-shallow dopant region 310 (shallow P$^+$) enhances the coupling ratio of the single-poly NVM cell 4a.

To form such multi-well scheme (shallow P$^+$ 310/shallow P$^-$ 312/shallow N$^-$ 320/P-Sub 10), a patterned implant mask layer (not shown) may be formed on the semiconductor substrate 10 to reveal the second OD region 104. A first ion implantation process may be carried out to implant N type dopants into the second OD region 104 to form the shallow N$^-$ 320. A second ion implantation process is then carried out to implant P type dopants into the second OD region 104 to form the shallow P$^-$ 312. A third ion implantation process is then carried out to implant P type dopants into the second OD region 104 to form the shallow P$^+$ 310. Thereafter, a thermal oxidation process is performed to form the gate dielectric layer 308. An etch-back process may be performed to remove an upper portion of the gate dielectric layer 308. By thinning down the thickness of the gate dielectric layer 308, the coupling ratio of the memory cell is increased.

According to another embodiment, to form such multi-well scheme (shallow P$^+$ 310/shallow P$^-$ 312/shallow N$^-$ 320/P-Sub 10), a patterned implant mask layer (not shown) may be formed on the semiconductor substrate 10 to reveal the second OD region 104. A first ion implantation process may be carried out to implant N type dopants into the second OD region 104 to form the shallow N$^-$ 320. A second ion implantation process is then carried out to implant P type dopants into the second OD region 104 to form the shallow P$^-$ 312. Thereafter, a thermal oxidation process is performed to form the gate dielectric layer 308. After the formation of the gate dielectric layer 308, a third ion implantation process is carried out to implant P type dopants into the second OD region 104 to form a shallow P$^+$ 310. The heavily doped shallow P$^+$ 310 helps increase the coupling ratio.

According to still another embodiment, the shallow P$^+$ 310, the shallow P$^-$ 312 and shallow N$^-$ 320 may be formed after the formation of the gate dielectric layer 308. For example, a thermal oxidation process is first performed to form the gate dielectric layer 308. A first ion implantation process may be carried out to implant N type dopants into the second OD region 104 to form the shallow N$^-$ 320. A second and third ion implantation processes are then carried out to implant P type dopants into the second OD region 104 to form the shallow P$^+$ 310 and the shallow P$^-$ 312.

It should be recognized that although the present invention has been illustrated schematically with the use of certain conductivity types, the opposite conductive types can also be implemented.

Figure 4B:
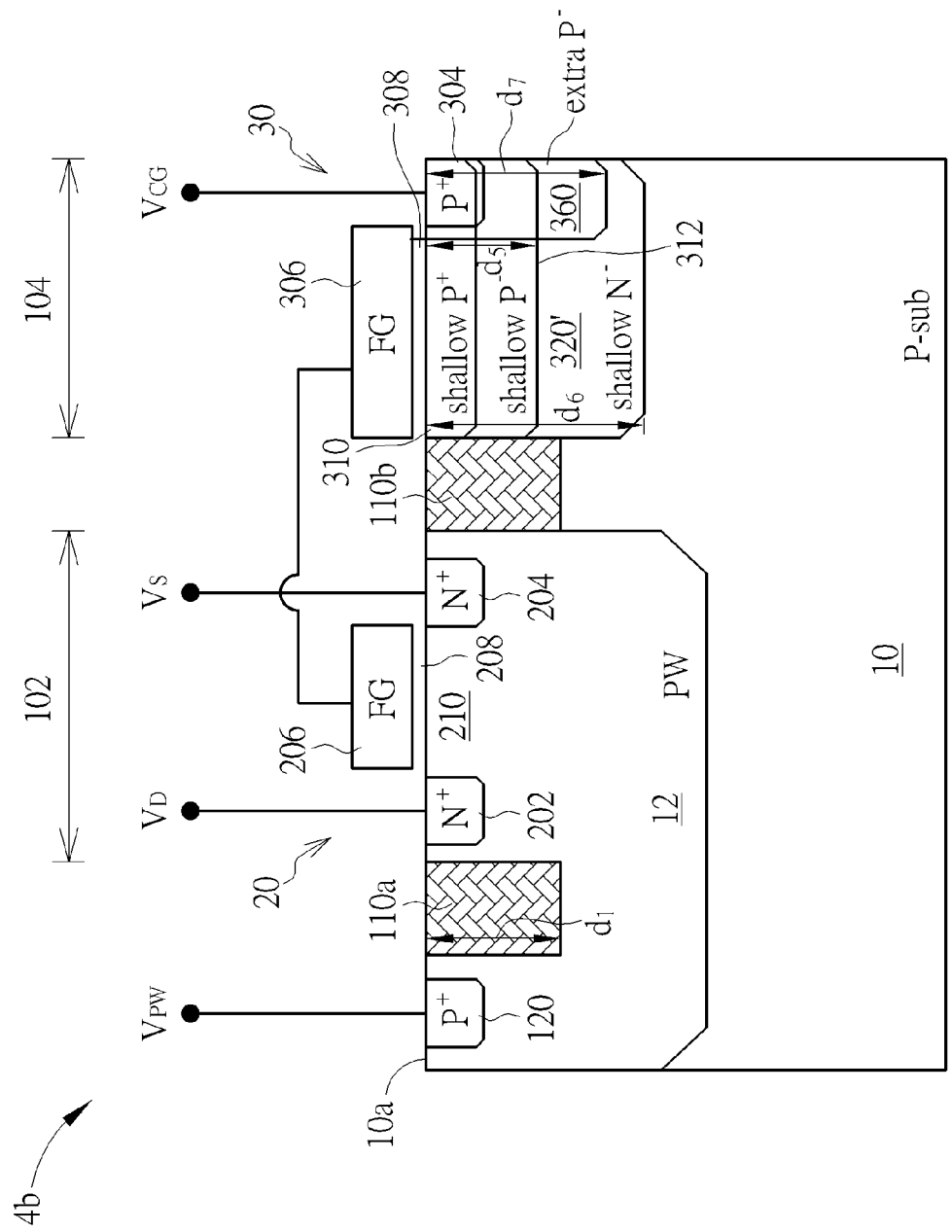
FIG. 4B is a partial, schematic, cross-sectional view of a single-poly NVM cell in accordance with another embodiment of the invention, wherein the read transistor is NMOS.

FIG. 4B is a partial, schematic, cross-sectional view of a single-poly NVM cell having an NMOS read transistor. As shown in FIG. 4B, according to another embodiment, the read transistor 20 of the single-poly NVM cell 4b may be an NMOS transistor formed in the ion well 12 of P type (PW) that may be electrically connected to a P well voltage ($V_{PW}$) through a P$^+$ contact region 120. Likewise, the single-poly NVM cell 4b further includes a coupling capacitor 30. The coupling capacitor 30 is formed within the second OD region 104. The coupling capacitor 30 comprises a shallow ion well 320' of the second conductivity type, a heavily-doped, ultra-shallow dopant region 310 in the shallow ion well 320' of the second conductivity type, a lightly-doped dopant region 312 of the first conductivity type, a contact region 304 in the heavily-doped, ultra-shallow dopant region 310, an extra P$^-$ region 360 encompassing the contact region 304, a charge storage floating gate 306 formed of a single polycrystalline silicon layer overlying the heavily-doped, ultra-shallow dopant region 310, and a gate dielectric layer 308 between the charge storage floating gate 306 and heavily-doped, ultra-shallow dopant region 310.

According to the embodiment, the shallow ion well 320' of the second conductivity type may be a shallow N well, the heavily-doped, ultra-shallow dopant region 310 may be a P$^+$ or N$^+$ ultra-shallow dopant region, the lightly-doped dopant region 312 of the first conductivity type is a P$^-$ dopant region, and the contact region 304 may be a P$^+$ or N$^+$ contact region. It is noteworthy that the shallow ion well 320' of the second conductivity type is formed directly within the semiconductor substrate 10, and is not formed within any ion well. A PN junction 313 between the shallow ion well 320' of the second conductivity type and the lightly-doped dopant region 312 of the first conductivity type has a junction depth $d_5$ that is shallower than the trench depth $d_1$ of the STI regions 110a and 110b.

According to the embodiment, the charge storage floating gate 306 of the coupling capacitor 30 is electrically coupled to the floating gate 206 of the read transistor 20. The P$^+$ contact region 304, the heavily-doped, ultra-shallow dopant region 310, the lightly-doped dopant region 312 of the first conductivity type, and the shallow ion well 320' of the second conductivity type (shallow N well or shallow N$^-$) may be commonly connected to a control gate voltage ($V_{CG}$). The shallow ion well 320' of the second conductivity type and the heavily-doped, ultra-shallow dopant region 310 may be electrically coupled to $V_{CG}$ through the contact region 304 formed within the ultra-shallow dopant region 310. The gate dielectric layers 208 and 308 are made of the same material and have the same thickness as that used in the logic circuitry on the same integrated circuit chip.

Figure 5A:
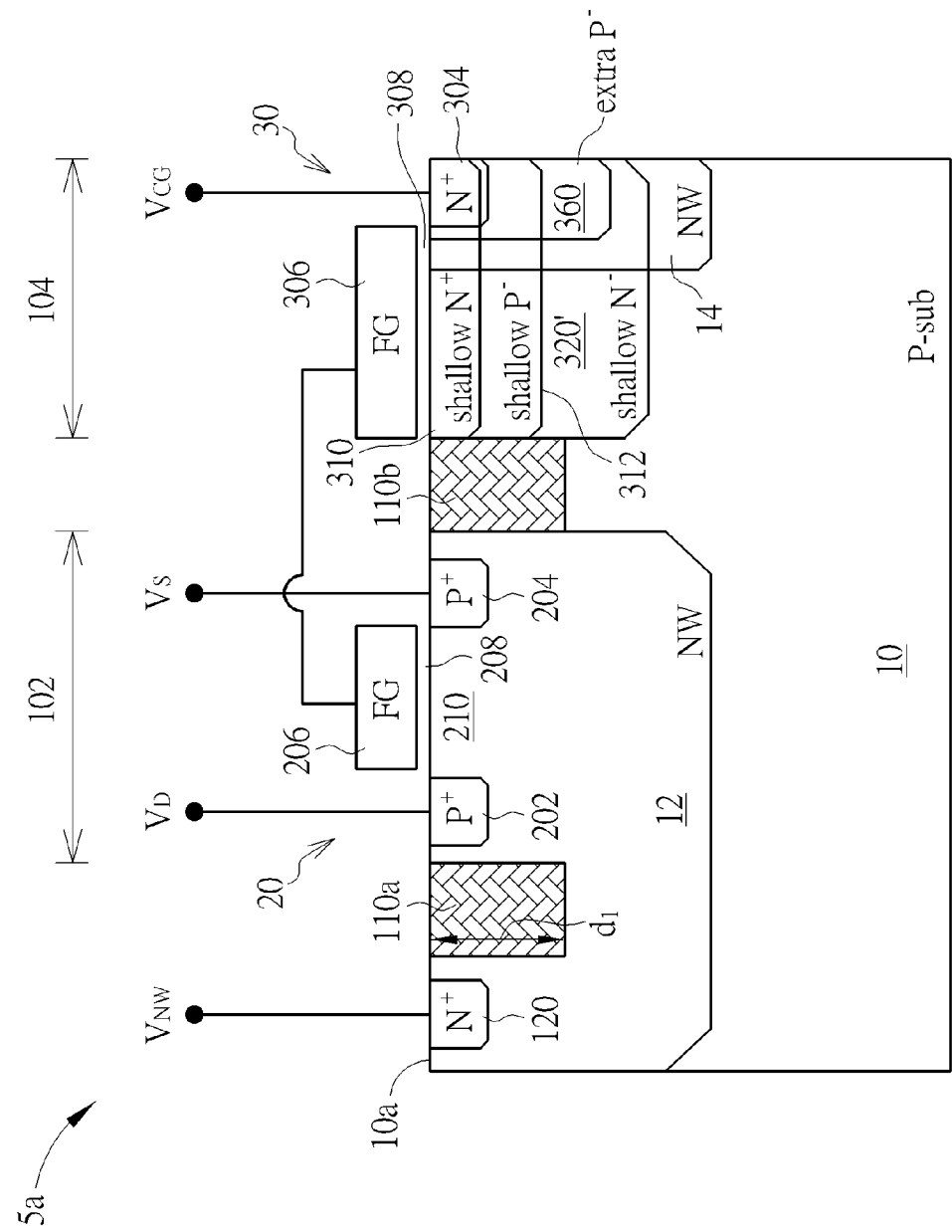
FIG. 5A is a partial, schematic, cross-sectional view of a single-poly NVM cell in accordance with yet another embodiment of the invention, wherein the read transistor is NMOS, and the coupling capacitor comprises a multi-well scheme (shallow $P^+$/shallow $P^-$/shallow $N^-$/P-Sub) with an extra $P^-$ region encompassing the $P^+$ contact region, wherein an additional N well (NW) is provided within the second OD region.

FIG. 5A is a partial, schematic, cross-sectional view of a single-poly NVM cell in accordance with yet another embodiment of the invention. As shown in FIG. 5A, the single-poly NVM cell 5a comprises a semiconductor substrate 10 having a first conductivity type. For example, the semiconductor substrate 10 may be a P-type silicon substrate (P-Sub) according to the embodiment. An ion well 12 of a second conductivity type is formed in a major surface 10a of the semiconductor substrate 10. For example, the ion well 12 of the second conductivity type may be an N well (NW) according to the embodiment. The ion well 12 of the second conductivity type may be electrically coupled to $V_{NW}$ through an N+ contact region 120 formed within the ion well 12 of the second conductivity type.

Likewise, STI regions 110a and 110b are formed in the major surface 10a of the semiconductor substrate 10. The STI region 110b separates two oxide-define (OD) regions or active areas: the first OD region 102 and the second OD region 104. The STI regions 110a and 110b extend into the semiconductor substrate 10 to a trench depth $d_1$ that is shallower than the junction depth of the ion well 12. For example, the trench depth $d_1$ may range between 0.1 micrometers and 1.0 micrometers.

A read transistor 20 is formed within the first OD region 102. According to the embodiment, the read transistor 20 is a PMOS transistor and may comprise a P+ drain region 202, a P+ source region 204, a channel region 210 between the P+ drain region 202 and the P+ source region 204, a floating gate 206 formed of a single polycrystalline silicon layer overlying the channel region 210, and a gate dielectric layer 208 between the floating gate 206 and the channel region 210. The P+ drain region 202 is separated from the N+ contact region 120 by the STI region 110a. According to the embodiment, the gate dielectric layer 208 is made of the same material and has the same thickness as that used in the logic circuitry on the same integrated circuit chip. The P+ drain region 202 may be electrically coupled to a drain voltage ($V_D$) and the P+ source region 204 may be electrically coupled to a source voltage ($V_S$).

A coupling capacitor 30 is formed within the second OD region 104. According to the embodiment, the coupling capacitor 30 may comprise a shallow ion well 320' of the second conductivity type, a heavily-doped, ultra-shallow dopant region 310, a contact region 304 in the heavily-doped, ultra-shallow dopant region 310, and a lightly-doped dopant region 312 of the first conductivity type. The heavily-doped, ultra-shallow dopant region 310 is formed within the lightly-doped dopant region 312 of the first conductivity type. A charge storage floating gate 306 formed of a single polycrystalline silicon layer overlies the heavily-doped, ultra-shallow dopant region 310. A gate dielectric layer 308 is provided between the charge storage floating gate 306 and heavily-doped, ultra-shallow dopant region 310.

According to the embodiment, the shallow ion well 320' of the second conductivity type may be a shallow N well, the heavily-doped, ultra-shallow dopant region 310 may be an N+ ultra-shallow dopant region, and the contact region 304 of the first conductivity type may be an N+ contact region. A PN junction 313 between the shallow ion well 320' of the second conductivity type and the lightly-doped dopant region 312 of the first conductivity type has a junction depth $d_5$ that is shallower than the trench depth $d_1$ of the STI regions 110a and 110b.

The single-poly NVM cell 4a further comprises an extra P− region 360 encompassing the P+ contact region 304. The extra P− region 360 has a junction depth $d_7$ that is deeper than $d_5$. The extra P− region 360 overlaps with a right portion of the lightly-doped dopant region 312 of the first conductivity type. The extra P− region 360 increases breakdown voltage of the memory device.

An additional ion well 14 of the second conductivity type such as an N well (NW) according to the embodiment is provided within the second OD region 104. The ion well 14 of the second conductivity type, which is spaced apart from the ion well 12, partially overlaps with the second OD region 104. The ion well 14 of the second conductivity type partially overlaps with the well structure consisting of the heavily-doped, ultra-shallow dopant region 310 (shallow N+), the lightly-doped dopant region 312 of the first conductivity type (shallow P−), and the shallow ion well 320' of the second conductivity type (shallow N−). According to the embodiment, the ion wells 12 and 14 may be formed by using the same photo mask and the same ion implantation process, and therefore may have substantially the same doping concentration and junction depth. The P+ contact region 304 and the extra P− region 360 are formed within the ion well 14 of the second conductivity type. The charge storage floating gate 306 partially overlaps with the ion well 14 of the second conductivity type.

It is to be understood that according to another embodiment, the heavily-doped, ultra-shallow dopant region 310 may have the first conductivity type. For example, the shallow ion well 320' may be a shallow N well, the heavily-doped and the ultra-shallow dopant region 310 may be an P+ ultra-shallow dopant region.

According to the embodiment, the charge storage floating gate 306 of the coupling capacitor 30 is electrically coupled to the floating gate 206 of the read transistor 20. The P+ contact region 304, the heavily-doped, ultra-shallow dopant region 310 (shallow N+), the lightly-doped dopant region 312 of the first conductivity type (shallow P−), the extra P− region 360, and the shallow ion well 320' of the second conductivity type (shallow N−) may be commonly connected to a control gate voltage ($V_{CG}$). The shallow ion well 320' of the second conductivity type and the heavily-doped, ultra-shallow dopant region 310 (shallow N+) may be electrically coupled to $V_{CG}$ through the N+ contact region 304 formed within the ultra-shallow dopant region 310 of the first conductivity type (shallow N+). The gate dielectric layers 208 and 308 are made of the same material and have the same thickness as that used in the logic circuitry on the same integrated circuit chip. An additional layer or photomask may be added to the current single-poly logic process in order to form the shallow ion well 320' of the second conductivity type, the heavily-doped, ultra-shallow dopant region 310 (shallow N+), and the lightly-doped dopant region 312 of the first conductivity type.

It is to be understood that although not shown in the figures, a pair of sidewall spacers may be formed on the opposite sidewalls of each of the floating gates 206 and 306, and a lightly doped drain (LDD) regions may be formed under the sidewall spacers.

The P+ drain region 202, the P+ source region 204, the P+ contact region 304 have substantially the same NP junction depth. The shallow ion well 320' has a junction depth $d_6$. According to the embodiment, the junction depth $d_6$ is deeper than the junction depth $d_5$ and is deeper than the trench depth $d_1$ of the STI regions 110a and 110b, while shallower than the junction depth of the ion well 12. According to the embodiment, the multi-well scheme (shallow N+ 310/shallow P− 312/shallow N− 320/P-Sub 10) directly under the charge storage floating gate 306 may serve as a charge pumping element. The heavily-doped, ultra-shallow dopant region 310 (shallow N+) enhances the coupling ratio of the single-poly NVM cell 5a.

To form such multi-well scheme (shallow N+ 310/shallow P− 312/shallow N− 320/P-Sub 10), a patterned implant mask layer (not shown) may be formed on the semiconductor substrate 10 to reveal the second OD region 104. A first ion implantation process may be carried out to implant N type dopants into the second OD region 104 to form the shallow N− 320. A second ion implantation process is then carried out to implant P type dopants into the second OD region 104 to form the shallow P⁻ 312. A third ion implantation process is then carried out to implant N type dopants into the second OD region 104 to form the shallow N⁺ 310. Thereafter, a thermal oxidation process is performed to form the gate dielectric layer 308. An etch-back process may be performed to remove an upper portion of the gate dielectric layer 308. By thinning down the thickness of the gate dielectric layer 308, the coupling ratio of the memory cell is increased.

According to another embodiment, to form such multi-well scheme (shallow N⁺ 310/shallow P⁻ 312/shallow N⁻ 320/P-Sub 10), a patterned implant mask layer (not shown) may be formed on the semiconductor substrate 10 to reveal the second OD region 104. A first ion implantation process may be carried out to implant N type dopants into the second OD region 104 to form the shallow N⁻ 320. A second ion implantation process is then carried out to implant P type dopants into the second OD region 104 to form the shallow P⁻ 312. Thereafter, a thermal oxidation process is performed to form the gate dielectric layer 308. After the formation of the gate dielectric layer 308, a third ion implantation process is carried out to implant N type dopants into the second OD region 104 to form a shallow N⁺ 310. The heavily doped shallow N⁺ 310 helps increase the coupling ratio.

According to still another embodiment, the shallow N⁺ 310, the shallow P⁻ 312 and shallow N⁻ 320 may be formed after the formation of the gate dielectric layer 308. For example, a thermal oxidation process is first performed to form the gate dielectric layer 308. A first ion implantation process may be carried out to implant N type dopants into the second OD region 104 to form the shallow N⁻ 320. A second and third ion implantation processes are then carried out to implant dopants into the second OD region 104 to form the shallow N⁺ 310 and the shallow P⁻ 312 respectively.

It should be recognized that although the present invention has been illustrated schematically with the use of certain conductivity types, the opposite conductive types can also be implemented.

Figure 5B:
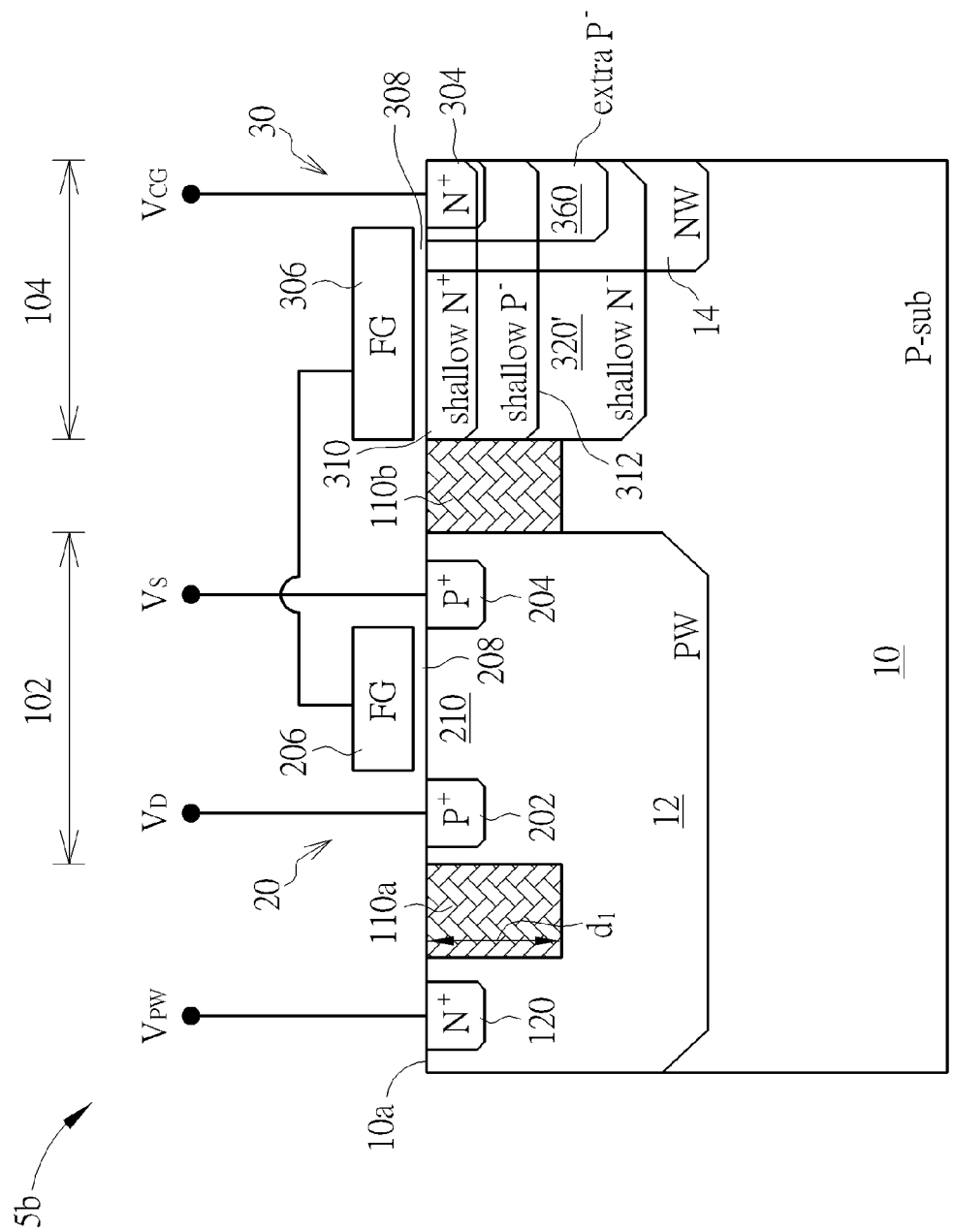
FIG. 5B is a partial, schematic, cross-sectional view of a single-poly NVM cell in accordance with another embodiment of the invention, wherein the read transistor is NMOS.

FIG. 5B is a partial, schematic, cross-sectional view of a single-poly NVM cell having an NMOS read transistor. As shown in FIG. 5B, according to another embodiment, the read transistor 20 of the single-poly NVM cell 5b may be an NMOS transistor formed in the ion well 12 of P type (PW) that may be electrically connected to a P well voltage ($V_{PW}$) through a P⁺ contact region 120. Likewise, the single-poly NVM cell 5b further includes a coupling capacitor 30. The coupling capacitor 30 is formed within the second OD region 104. The coupling capacitor 30 comprises a shallow ion well 320' of the second conductivity type, a heavily-doped, ultra-shallow dopant region 310 in the shallow ion well 320' of the second conductivity type, a lightly-doped dopant region 312 of the first conductivity type, a contact region 304 in the heavily-doped, ultra-shallow dopant region 310, an extra P⁻ region 360 encompassing the contact region 304, a charge storage floating gate 306 formed of a single polycrystalline silicon layer overlying the heavily-doped, ultra-shallow dopant region 310, and a gate dielectric layer 308 between the charge storage floating gate 306 and heavily-doped, ultra-shallow dopant region 310.

An additional ion well 14 of the second conductivity type such as an N well (NW) according to the embodiment is provided within the second OD region 104. The ion well 14 of the second conductivity type, which is spaced apart from the ion well 12 of P type, partially overlaps with the second OD region 104. The ion well 14 of the second conductivity type partially overlaps with the well structure consisting of the heavily-doped, ultra-shallow dopant region 310 (shallow N⁺), the lightly-doped dopant region 312 of the first conductivity type (shallow P⁻), and the shallow ion well 320' of the second conductivity type (shallow N⁻).

According to the embodiment, the shallow ion well 320' of the second conductivity type may be a shallow N well, the heavily-doped, ultra-shallow dopant region 310 may be an N⁺ ultra-shallow dopant region, the lightly-doped dopant region 312 of the first conductivity type is a P⁻ dopant region, and the contact region 304 may be an N⁺ contact region. A PN junction 313 between the shallow ion well 320' of the second conductivity type and the lightly-doped dopant region 312 of the first conductivity type has a junction depth d5 that is shallower than the trench depth d1 of the STI regions 110a and 110b.

According to the embodiment, the charge storage floating gate 306 of the coupling capacitor 30 is electrically coupled to the floating gate 206 of the read transistor 20. The P⁺ contact region 304, the heavily-doped, ultra-shallow dopant region 310, the lightly-doped dopant region 312 of the first conductivity type, and the shallow ion well 320' of the second conductivity type (shallow N⁻) may be commonly connected to a control gate voltage ($V_{CG}$). The shallow ion well 320' of the second conductivity type and the heavily-doped, ultra-shallow dopant region 310 may be electrically coupled to $V_{CG}$ through the contact region 304 formed within the ultra-shallow dopant region 310. The gate dielectric layers 208 and 308 are made of the same material and have the same thickness as that used in the logic circuitry on the same integrated circuit chip.

Figure 6A:
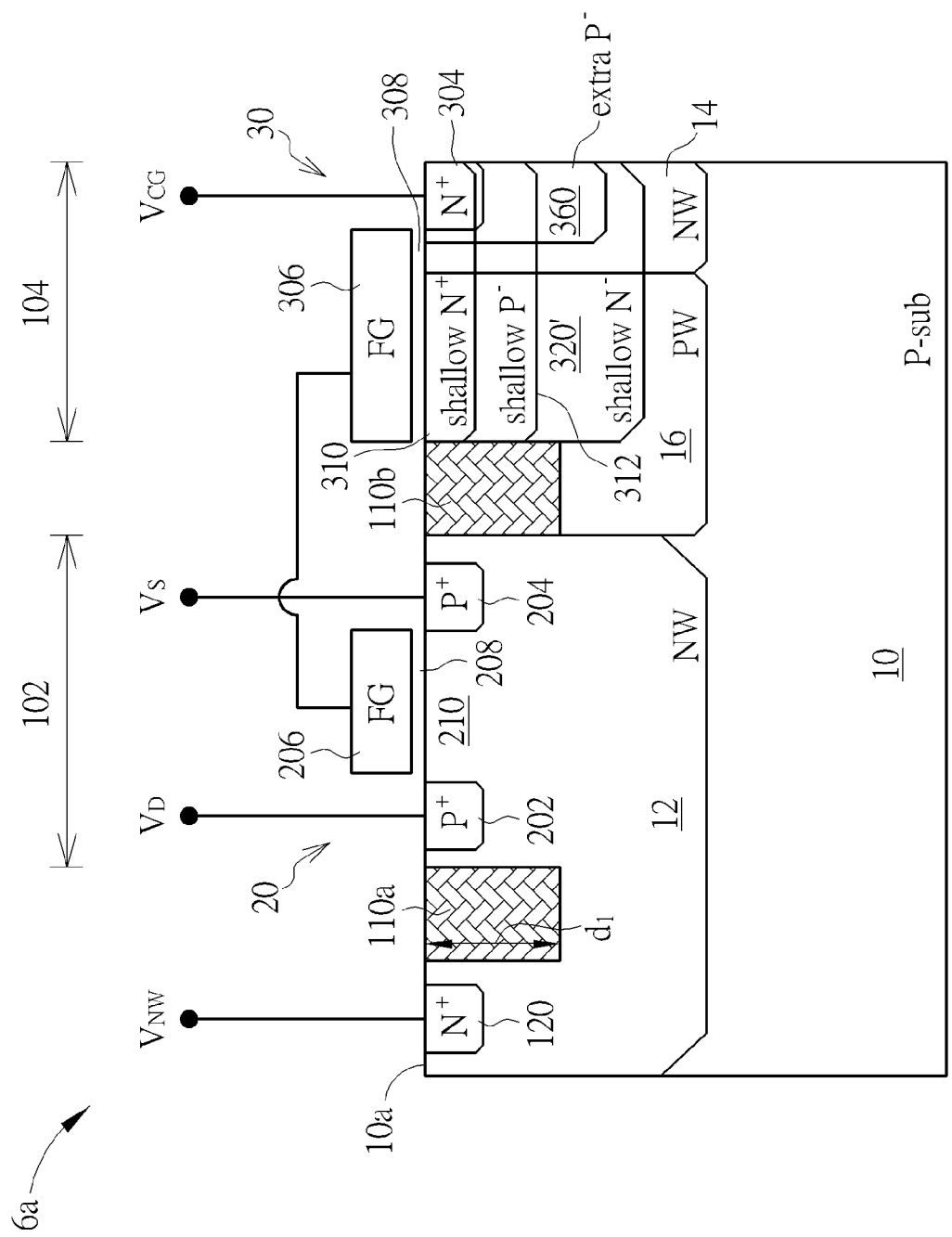
FIG. 6A is a partial, schematic, cross-sectional view of a single-poly NVM cell in accordance with yet another embodiment of the invention, wherein the read transistor is NMOS, and the coupling capacitor comprises a multi-well scheme (shallow $P^+$/shallow $P^-$/shallow $N^-$/P-Sub) with an extra $P^-$ region encompassing the $P^+$ contact region, wherein an additional N well (NW) and an additional P well (PW) are provided within the second OD region.

FIG. 6A is a partial, schematic, cross-sectional view of a single-poly NVM cell in accordance with yet another embodiment of the invention. As shown in FIG. 6A, the single-poly NVM cell 6a comprises a semiconductor substrate 10 having a first conductivity type. For example, the semiconductor substrate 10 may be a P-type silicon substrate (P-Sub) according to the embodiment. An ion well 12 of a second conductivity type is formed in a major surface 10a of the semiconductor substrate 10. For example, the ion well 12 of the second conductivity type may be an N well (NW) according to the embodiment. The ion well 12 of the second conductivity type may be electrically coupled to $V_{NW}$ through an N⁺ contact region 120 formed within the ion well 12 of the second conductivity type.

Likewise, STI regions 110a and 110b are formed in the major surface 10a of the semiconductor substrate 10. The STI region 110b separates two oxide-define (OD) regions or active areas: the first OD region 102 and the second OD region 104. The STI regions 110a and 110b extend into the semiconductor substrate 10 to a trench depth $d_1$ that is shallower than the junction depth of the ion well 12. For example, the trench depth $d_1$ may range between 0.1 micrometers and 1.0 micrometers. The ion well 12 of the second conductivity type completely overlaps with the first OD region 102.

A read transistor 20 is formed within the first OD region 102. According to the embodiment, the read transistor 20 is a PMOS transistor and may comprise a P⁺ drain region 202, a P⁺ source region 204, a channel region 210 between the P⁺ drain region 202 and the P⁺ source region 204, a floating gate 206 formed of a single polycrystalline silicon layer overlying the channel region 210, and a gate dielectric layer 208 between the floating gate 206 and the channel region 210. The P⁺ drain region 202 is separated from the N⁺ contact region 120 by the STI region 110a. According to the embodiment, the gate dielectric layer 208 is made of the same material and has the same thickness as that used in the logic circuitry on the same integrated circuit chip. The P⁺ drain region 202 may be electrically coupled to a drain voltage ($V_D$) and the P+ source region 204 may be electrically coupled to a source voltage ($V_S$).

A coupling capacitor 30 is formed within the second OD region 104. According to the embodiment, the coupling capacitor 30 may comprise a shallow ion well 320' of the second conductivity type, a heavily-doped, ultra-shallow dopant region 310, a contact region 304 in the heavily-doped, ultra-shallow dopant region 310, and a lightly-doped dopant region 312 of the first conductivity type. The heavily-doped, ultra-shallow dopant region 310 is formed within the lightly-doped dopant region 312 of the first conductivity type. A charge storage floating gate 306 formed of a single polycrystalline silicon layer overlies the heavily-doped, ultra-shallow dopant region 310. A gate dielectric layer 308 is provided between the charge storage floating gate 306 and heavily-doped, ultra-shallow dopant region 310.

According to the embodiment, the shallow ion well 320' of the second conductivity type may be a shallow N well, the heavily-doped, ultra-shallow dopant region 310 may be an N+ ultra-shallow dopant region, and the contact region 304 of the first conductivity type may be an N+ contact region. A PN junction 313 between the shallow ion well 320' of the second conductivity type and the lightly-doped dopant region 312 of the first conductivity type has a junction depth $d_5$ that is shallower than the trench depth $d_1$ of the STI regions 110a and 110b.

The single-poly NVM cell 4a further comprises an extra P⁻ region 360 encompassing the P+ contact region 304. The extra P⁻ region 360 has a junction depth $d_7$ that is deeper than $d_5$. The extra P⁻ region 360 overlaps with a right portion of the lightly-doped dopant region 312 of the first conductivity type. The extra P⁻ region 360 increases breakdown voltage of the memory device.

An additional ion well 14 of the second conductivity type such as an N well (NW) according to the embodiment is provided within the second OD region 104. The ion well 14 of the second conductivity type, which is spaced apart from the ion well 12, partially overlaps with the second OD region 104. The ion well 14 of the second conductivity type partially overlaps with the well structure consisting of the heavily-doped, ultra-shallow dopant region 310 (shallow N+), the lightly-doped dopant region 312 of the first conductivity type (shallow P⁻), and the shallow ion well 320' of the second conductivity type (shallow N⁻). According to the embodiment, the ion wells 12 and 14 may be formed by using the same photo mask and the same ion implantation process, and therefore may have substantially the same doping concentration and junction depth. The P+ contact region 304 and the extra P⁻ region 360 are formed within the ion well 14 of the second conductivity type. The charge storage floating gate 306 partially overlaps with the ion well 14 of the second conductivity type.

An additional ion well 16 of the first conductivity type such as a P well (PW) according to the embodiment is provided within the second OD region 104. The ion well 16 of the first conductivity type partially overlaps with the second OD region 104. The ion well 16 of the first conductivity type partially overlaps with the well structure consisting of the heavily-doped, ultra-shallow dopant region 310 (shallow N+), the lightly-doped dopant region 312 of the first conductivity type (shallow P⁻), and the shallow ion well 320' of the second conductivity type (shallow N⁻) on the left side of the charge storage floating gate 306. The STI region 110b is disposed within the ion well 16 of the first conductivity type. The ion well 16 of the first conductivity type is interposed between the ion well 12 and the ion well 14.

It is to be understood that according to another embodiment, the heavily-doped, ultra-shallow dopant region 310 may have the first conductivity type. For example, the shallow ion well 320' may be a shallow N well, the heavily-doped and the ultra-shallow dopant region 310 may be a P+ ultra-shallow dopant region.

According to the embodiment, the charge storage floating gate 306 of the coupling capacitor 30 is electrically coupled to the floating gate 206 of the read transistor 20. The P+ contact region 304, the heavily-doped, ultra-shallow dopant region 310 (shallow N+), the lightly-doped dopant region 312 of the first conductivity type (shallow P⁻), the extra P⁻ region 360, and the shallow ion well 320' of the second conductivity type (shallow N⁻) may be commonly connected to a control gate voltage ($V_{CG}$). The shallow ion well 320' of the second conductivity type and the heavily-doped, ultra-shallow dopant region 310 (shallow N+) may be electrically coupled to $V_{CG}$ through the N+ contact region 304 formed within the ultra-shallow dopant region 310 of the first conductivity type (shallow N+). The gate dielectric layers 208 and 308 are made of the same material and have the same thickness as that used in the logic circuitry on the same integrated circuit chip. An additional layer or photomask may be added to the current single-poly logic process in order to form the shallow ion well 320' of the second conductivity type, the heavily-doped, ultra-shallow dopant region 310 (shallow N+), and the lightly-doped dopant region 312 of the first conductivity type.

It is to be understood that although not shown in the figures, a pair of sidewall spacers may be formed on the opposite sidewalls of each of the floating gates 206 and 306, and a lightly doped drain (LDD) regions may be formed under the sidewall spacers.

The P+ drain region 202, the P+ source region 204, the P+ contact region 304 have substantially the same NP junction depth. The shallow ion well 320' has a junction depth $d_6$. According to the embodiment, the junction depth $d_6$ is deeper than the junction depth $d_5$ and is deeper than the trench depth $d_1$ of the STI regions 110a and 110b, while shallower than the junction depth of the ion well 12. According to the embodiment, the multi-well scheme (shallow N+ 310/shallow P⁻ 312/shallow N⁻ 320/P-Sub 10) directly under the charge storage floating gate 306 may serve as a charge pumping element. The heavily-doped, ultra-shallow dopant region 310 (shallow N+) enhances the coupling ratio of the single-poly NVM cell 5a.

To form such multi-well scheme (shallow N+ 310/shallow P⁻ 312/shallow N⁻ 320/P-Sub 10), a patterned implant mask layer (not shown) may be formed on the semiconductor substrate 10 to reveal the second OD region 104. A first ion implantation process may be carried out to implant N type dopants into the second OD region 104 to form the shallow N⁻ 320. A second ion implantation process is then carried out to implant P type dopants into the second OD region 104 to form the shallow P⁻ 312. A third ion implantation process is then carried out to implant N type dopants into the second OD region 104 to form the shallow N+ 310. Thereafter, a thermal oxidation process is performed to form the gate dielectric layer 308. An etch-back process may be performed to remove an upper portion of the gate dielectric layer 308. By thinning down the thickness of the gate dielectric layer 308, the coupling ratio of the memory cell is increased.

According to another embodiment, to form such multi-well scheme (shallow N+ 310/shallow P⁻ 312/shallow N⁻ 320/P-Sub 10), a patterned implant mask layer (not shown) may be formed on the semiconductor substrate 10 to reveal the second OD region 104. A first ion implantation process may be carried out to implant N type dopants into the second OD region 104 to form the shallow N⁻ 320. A second ion implantation process is then carried out to implant P type dopants into the second OD region 104 to form the shallow P⁻ 312. Thereafter, a thermal oxidation process is performed to form the gate dielectric layer 308. After the formation of the gate dielectric layer 308, a third ion implantation process is carried out to implant N type dopants into the second OD region 104 to form a shallow N⁺ 310. The heavily doped shallow N⁺ 310 helps increase the coupling ratio.

According to still another embodiment, the shallow N⁺ 310, the shallow P⁻ 312 and shallow N⁻ 320 may be formed after the formation of the gate dielectric layer 308. For example, a thermal oxidation process is first performed to form the gate dielectric layer 308. A first ion implantation process may be carried out to implant N type dopants into the second OD region 104 to form the shallow N⁻ 320. A second and third ion implantation processes are then carried out to implant dopants into the second OD region 104 to form the shallow N⁺ 310 and the shallow P⁻ 312 respectively.

It should be recognized that although the present invention has been illustrated schematically with the use of certain conductivity types, the opposite conductive types can also be implemented.

Figure 6B:
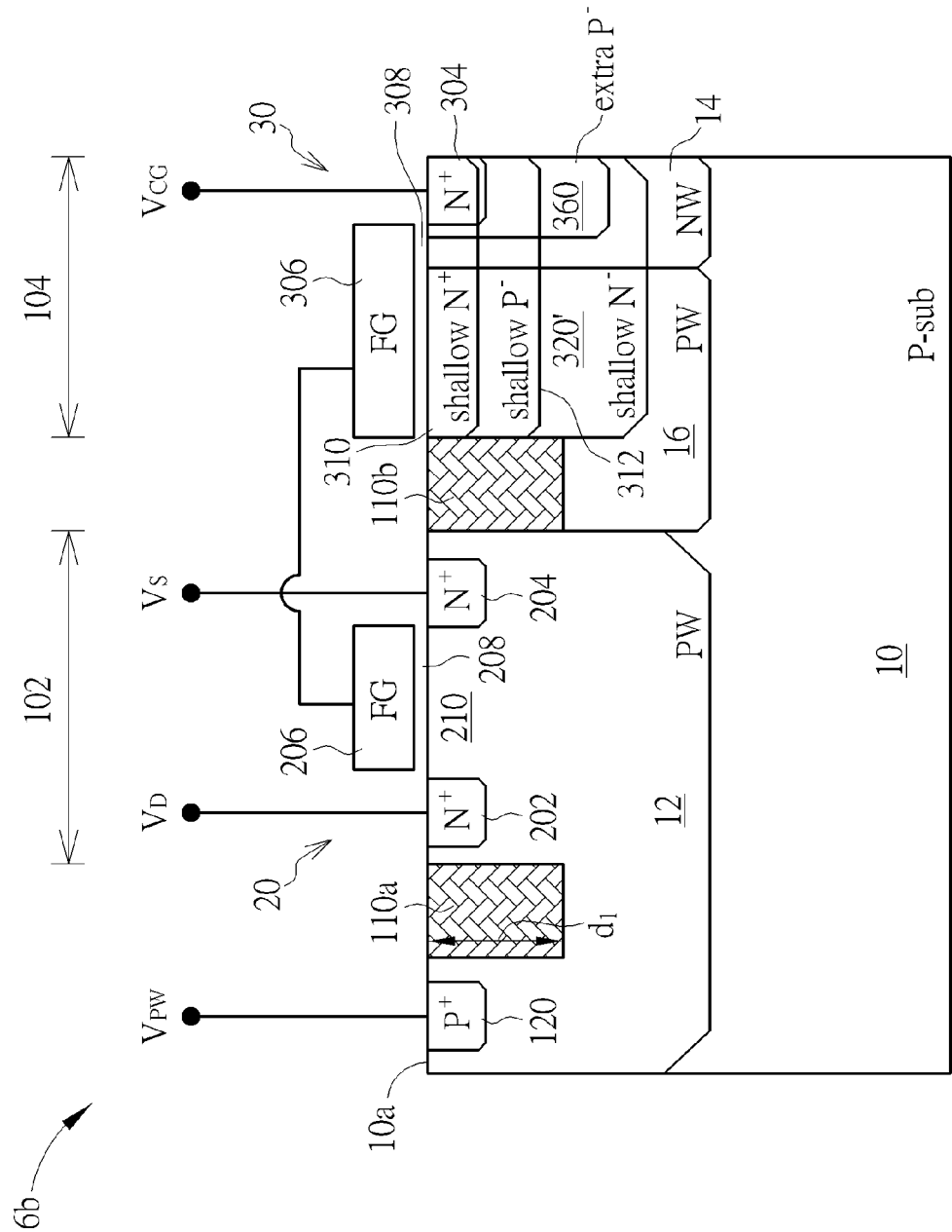
FIG. 6B is a partial, schematic, cross-sectional view of a single-poly NVM cell in accordance with another embodiment of the invention, wherein the read transistor is NMOS.

FIG. 6B is a partial, schematic, cross-sectional view of a single-poly NVM cell having an NMOS read transistor. As shown in FIG. 6B, according to another embodiment, the read transistor 20 of the single-poly NVM cell 6b may be an NMOS transistor formed in the ion well 12 of P type (PW) that may be electrically connected to a P well voltage ($V_{PW}$) through a P⁺ contact region 120. Likewise, the single-poly NVM cell 6b further includes a coupling capacitor 30. The coupling capacitor 30 is formed within the second OD region 104. The coupling capacitor 30 comprises a shallow ion well 320' of the second conductivity type, a heavily-doped, ultra-shallow dopant region 310 in the shallow ion well 320' of the second conductivity type, a lightly-doped dopant region 312 of the first conductivity type, a contact region 304 in the heavily-doped, ultra-shallow dopant region 310, an extra P⁻ region 360 encompassing the contact region 304, a charge storage floating gate 306 formed of a single polycrystalline silicon layer overlying the heavily-doped, ultra-shallow dopant region 310, and a gate dielectric layer 308 between the charge storage floating gate 306 and heavily-doped, ultra-shallow dopant region 310.

An additional ion well 14 of the second conductivity type such as an N well (NW) according to the embodiment is provided within the second OD region 104. The ion well 14 of the second conductivity type, which is spaced apart from the ion well 12 of P type, partially overlaps with the second OD region 104. The ion well 14 of the second conductivity type partially overlaps with the well structure consisting of the heavily-doped, ultra-shallow dopant region 310 (shallow N⁺), the lightly-doped dopant region 312 of the first conductivity type (shallow P⁻), and the shallow ion well 320' of the second conductivity type (shallow N⁻).

An additional ion well 16 of the first conductivity type such as a P well (PW) according to the embodiment is provided within the second OD region 104 between the ion well 12 and the ion well 14. The ion well 16 of the first conductivity type partially overlaps with the second OD region 104. The ion well 16 of the first conductivity type partially overlaps with the well structure consisting of the heavily-doped, ultra-shallow dopant region 310 (shallow N+), the lightly-doped dopant region 312 of the first conductivity type (shallow P⁻), and the shallow ion well 320' of the second conductivity type (shallow N⁻) on the left side of the charge storage floating gate 306.

According to the embodiment, the shallow ion well 320' of the second conductivity type may be a shallow N well, the heavily-doped, ultra-shallow dopant region 310 may be an N⁺ ultra-shallow dopant region, the lightly-doped dopant region 312 of the first conductivity type is a P⁻ dopant region, and the contact region 304 may be an N⁺ contact region. A PN junction 313 between the shallow ion well 320' of the second conductivity type and the lightly-doped dopant region 312 of the first conductivity type has a junction depth d5 that is shallower than the trench depth d1 of the STI regions 110a and 110b.

According to the embodiment, the charge storage floating gate 306 of the coupling capacitor 30 is electrically coupled to the floating gate 206 of the read transistor 20. The P⁺ contact region 304, the heavily-doped, ultra-shallow dopant region 310, the lightly-doped dopant region 312 of the first conductivity type, and the shallow ion well 320' of the second conductivity type (shallow N⁻) may be commonly connected to a control gate voltage ($V_{CG}$). The shallow ion well 320' of the second conductivity type and the heavily-doped, ultra-shallow dopant region 310 may be electrically coupled to $V_{CG}$ through the contact region 304 formed within the ultra-shallow dopant region 310. The gate dielectric layers 208 and 308 are made of the same material and have the same thickness as that used in the logic circuitry on the same integrated circuit chip.

Figure 7:
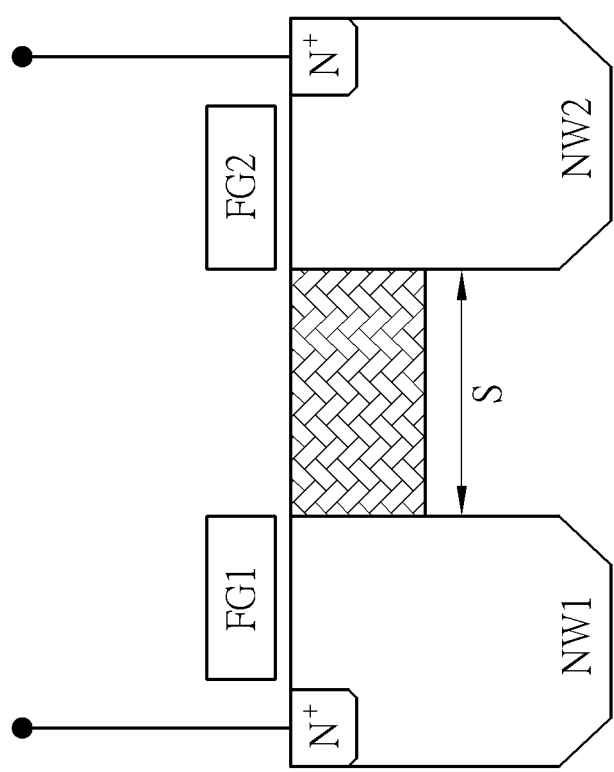
FIG. 7 is a schematic, cross-sectional diagram of a conventional cell structure.
Figure 8:
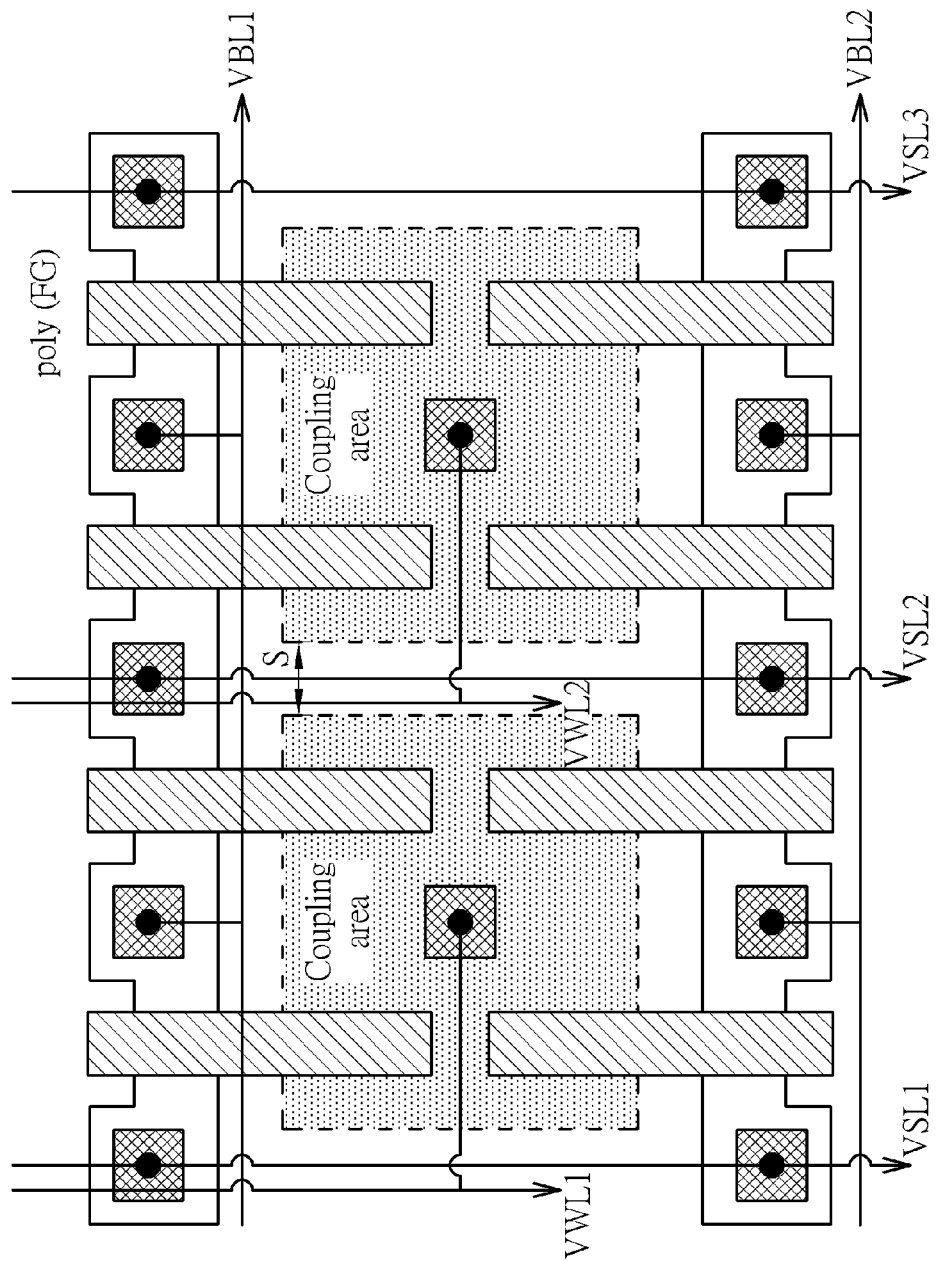
FIG. 8 shows an exemplary layout that illustrates the advantage of reduced spacing S between two adjacent coupling wells.

FIG. 7 is a schematic, cross-sectional diagram of a conventional cell structure. As shown in FIG. 7, the N well NW1 that is directly under the floating gate FG1 is spaced apart from the N well NW2 that is directly under the floating gate FG2. The spacing between NW1 and NW2 is denoted as S. The prior art has a larger S because of the NW-NW spacing design rule. For example, S should be 1.4 μm for 0.18 μm processes. For 0.18 μm processes, the N well junction depth may be about 10,000 angstroms, the STI depth may be about 2,300 angstroms, and the diffusion depth may be about 1,000 angstroms. Without the shallow N+/P+ in NW2, the control gate-to-floating gate coupling becomes worse. It is advantageous to use the present invention because the spacing S between two adjacent coupling wells can be reduced. For example, FIG. 8 shows an exemplary layout that illustrates the reduced spacing S between two adjacent coupling wells. In FIG. 8, each coupling area (coupling well) is electrically coupled to four floating gates (FG). Contact areas for the bit lines and coupling areas are also illustrated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A single-poly non-volatile memory (NVM) cell, comprising:
    a semiconductor substrate of a first conductivity type, having thereon an isolation region separating a first oxide define (OD) region from a second OD region;
    a first ion well in the semiconductor substrate, wherein the first ion well completely overlaps with the first oxide define region and does not overlap with the second oxide define region;
    a read transistor within the first OD region, the read transistor comprising a drain region, a source region, a channel region between the drain region and the source region, a floating gate formed of a single polycrystalline silicon layer overlying the channel region, and a gate dielectric layer between the floating gate and the channel region; and a coupling capacitor within the second OD region, the coupling capacitor comprising a shallow ion well of a second conductivity type opposite to the first conductivity type, a heavily-doped, ultra-shallow dopant region in the shallow ion well, a charge storage floating gate formed of a single polycrystalline silicon layer overlying the heavily-doped, ultra-shallow dopant region, and a gate dielectric layer between the charge storage floating gate and heavily-doped, ultra-shallow dopant region, wherein the charge storage floating gate of the coupling capacitor is electrically coupled to the floating gate of the read transistor, and wherein the shallow ion well has a junction depth that is substantially equal to or shallower than a trench depth of the isolation region.

2. The single-poly NVM cell according to claim 1 wherein the first ion well has the second conductivity type.

3. The single-poly NVM cell according to claim 1 wherein the first ion well has the first conductivity type.

4. The single-poly NVM cell according to claim 1 wherein the shallow ion well has the second conductivity type, the heavily-doped, ultra-shallow dopant region has the first conductivity type, and the contact region has the first conductivity type.

5. The single-poly NVM cell according to claim 2 wherein the shallow ion well, the heavily-doped, ultra-shallow dopant region, and the contact region have the second conductivity type.

6. The single-poly NVM cell according to claim 1 wherein a contact region is disposed in the heavily-doped, ultra-shallow dopant region.

7. The single-poly NVM cell according to claim 1 wherein a junction between the shallow ion well and the heavily-doped, ultra-shallow dopant region has a junction depth that is shallower than the trench depth of the isolation region.

8. The single-poly NVM cell according to claim 1 wherein the trench depth ranges between 0.1 micrometers and 1.0 micrometers.

9. The single-poly NVM cell according to claim 1 wherein the shallow ion well is formed directly within the semiconductor substrate, and is not formed within an ion well.

10. The single-poly NVM cell according to claim 1 wherein the first ion well is electrically coupled to a well voltage.

11. The single-poly NVM cell according to claim 6 wherein the contact region, the heavily-doped, ultra-shallow dopant region, and the shallow ion well are commonly connected to a control gate voltage.

12. The single-poly NVM cell according to claim 1 wherein the heavily-doped, ultra-shallow dopant region and the shallow ion well serve as a charge pumping element.

13. The single-poly NVM cell according to claim 6 further comprising an extra dopant region encompassing the contact region.

14. The single-poly NVM cell according to claim 13 wherein the extra dopant region partially overlaps with the shallow ion well and the heavily-doped, ultra-shallow dopant region.

15. The single-poly NVM cell according to claim 1 further comprising a lightly-doped dopant region of the first conductivity type, wherein the heavily-doped, ultra-shallow dopant region is formed within the lightly-doped dopant region of the first conductivity type.

16. The single-poly NVM cell according to claim 15 wherein a junction between the shallow ion well of the second conductivity type and the lightly-doped dopant region of the first conductivity type has a junction depth that is shallower than a trench depth of the isolation region.

17. The single-poly NVM cell according to claim 1 further comprising a second ion well of the second conductivity type within the second OD region.

18. The single-poly NVM cell according to claim 17 wherein the second ion well of the second conductivity type is spaced apart from the first ion well and partially overlaps with the second OD region.

19. The single-poly NVM cell according to claim 18 further comprising a third ion well of the first conductivity type within the second OD region between the first ion well and the second ion well.

20. The single-poly NVM cell according to claim 19 wherein the second ion well of the second conductivity type partially overlaps with the second OD region.

* * * * *